US012666601B2

(12) United States Patent
Park et al.

(10) Patent No.: US 12,666,601 B2
(45) Date of Patent: Jun. 23, 2026

(54) SEMICONDUCTOR MEMORY DEVICE

(71) Applicant: Samsung Electronics Co., Ltd.,
Suwon-si (KR)

(72) Inventors: Jul Pin Park, Suwon-si (KR); Jae Joon Song, Suwon-si (KR); Heon Jun Ha, Suwon-si (KR); Dong-Sik Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 377 days.

(21) Appl. No.: 18/220,861

(22) Filed: Jul. 12, 2023

(65) Prior Publication Data

US 2024/0138142 A1    Apr. 25, 2024
US 2024/0237333 A9    Jul. 11, 2024

(30) Foreign Application Priority Data

Oct. 21, 2022    (KR) ........................ 10-2022-0136317

(51) Int. Cl.
H10B 43/40        (2023.01)
H10B 12/00        (2023.01)
H10W 20/41        (2026.01)

(52) U.S. Cl.
CPC ......... H10B 12/482 (2023.02); H10B 12/315 (2023.02); H10B 12/485 (2023.02);
(Continued)

(58) Field of Classification Search
CPC .. H10B 12/482; H10B 12/315; H10B 12/485; H10B 12/488; H10B 12/50; H10B 12/00;
(Continued)

(56) References Cited

U.S. PATENT DOCUMENTS 8,372,715 B2    2/2013    Chung et al.
9,287,169 B2    3/2016    Myung et al.
(Continued)

FOREIGN PATENT DOCUMENTS

KR    1020100025615 A    3/2010
KR    1020130051778 A    5/2013
(Continued)

*Primary Examiner* — Samuel Park
(74) *Attorney, Agent, or Firm* — Muir Patent Law, PLLC

(57) ABSTRACT

Disclosed is a semiconductor memory device including a peripheral gate structure on a substrate, bitlines disposed on the peripheral gate structure and extending in a first direction, a protruding insulating pattern including channel trenches, extending in a second direction intersecting the first direction, channel structures disposed on the bitlines in the channel trenches and including a metal oxide, first wordlines disposed on the channel structures and extending in the second direction, second wordlines disposed on the channel structures, extending in the second direction, and spaced apart from the first wordlines in the first direction, landing pads disposed on the channel structures and connected to the channel structures, pad separation patterns disposed on the protruding insulating pattern and separating the landing pads, first passage patterns connected to the protruding insulating pattern through pad separation patterns and formed of an oxide-based insulating material, and data storage patterns disposed on the landing pads.

12 Claims, 26 Drawing Sheets

(52) U.S. Cl.
CPC ........... *H10B 12/488* (2023.02); *H10B 12/50*
(2023.02); *H10W 20/435* (2026.01)

(58) Field of Classification Search
CPC .... H10B 12/0335; H10B 12/34; H10B 12/48;
H10B 12/05; H10W 20/435; H01L
23/5283
See application file for complete search history.

(56) References Cited

U.S. PATENT DOCUMENTS

| | | | |
|---|---|---|---|
| 11,171,140 B2 | 11/2021 | Sukekawa | |
| 2009/0108318 A1* | 4/2009 | Yoon | H10D 88/01 |
| | | | 257/306 |
| 2011/0068384 A1* | 3/2011 | Kim | H10B 12/488 |
| | | | 257/302 |
| 2011/0223731 A1* | 9/2011 | Chung | H10D 30/63 |
| | | | 438/270 |
| 2015/0140808 A1* | 5/2015 | Myung | H01L 21/743 |
| | | | 438/643 |
| 2017/0263723 A1* | 9/2017 | Lee | H10D 62/113 |
| 2017/0287929 A1* | 10/2017 | Kim | H10B 43/27 |
| 2018/0286870 A1* | 10/2018 | Kim | H10B 12/34 |
| 2019/0252401 A1* | 8/2019 | Shin | H10B 41/27 |
| 2020/0083229 A1* | 3/2020 | Kim | G11C 5/063 |
| 2024/0292606 A1* | 8/2024 | Hua | H10B 12/053 |

FOREIGN PATENT DOCUMENTS

| | | | |
|---|---|---|---|
| KR | 1020160142803 A | 12/2016 | |
| KR | 1020200036951 A | 4/2020 | |
| KR | 1020210081735 A | 7/2021 | |
| KR | 1020220080511 A | 6/2022 | |
| KR | 1020220102242 A | 7/2022 | |

* cited by examiner

CAR

PCR

D2

D1

SEMICONDUCTOR MEMORY DEVICE

CROSS-REFERENCE TO RELATED APPLICATION

This application claims priority under 35 U.S.C. § 119 from Korean Patent Application No. 10-2022-0136317, filed on Oct. 21, 2022, in the Korean Intellectual Property Office, and all the benefits accruing therefrom under 35 U.S.C. § 119, the contents of which in its entirety are herein incorporated by reference.

BACKGROUND

1. Technical Field

The present disclosure relates to a semiconductor memory device, and more particularly, to a semiconductor memory device including a vertical channel transistor (VCT).

2. Description of the Related Art

There has been a demand for raising the integration density of semiconductor memory devices in order to meet customers' demands of high performance and low price. Particularly, the increase of integration density has been required because integration density is one of the most important price-determining factors for semiconductor memory devices.

The integration density of a conventional two-dimensional (2D) or planar semiconductor memory device is determined by the area occupied by unit memory cells and is thus considerably affected by the level of fine pattern-forming technology. However, as expensive equipment is needed for the miniaturization of patterns, there still exists a limit in increasing the integration density of a 2D semiconductor memory device. Accordingly, a semiconductor memory device including a vertical channel transistor (VCT) whose channel extends in a vertical direction has been suggested.

SUMMARY

Aspects of the present disclosure provide a semiconductor memory device with an improved integration density and improved electrical properties.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor memory device comprising a peripheral gate structure on a substrate, bitlines disposed on the peripheral gate structure and extending lengthwise in a first direction, a protruding insulating pattern including channel trenches, which extend in a second direction that intersects the first direction, channel structures disposed on the bitlines in the channel trenches and including a metal oxide, first wordlines disposed on the channel structures and extending lengthwise in the second direction, second wordlines disposed on the channel structures, extending lengthwise in the second direction, and spaced apart from the first wordlines in the first direction, landing pads disposed on the channel structures and connected to the channel structures, pad separation patterns disposed on the protruding insulating pattern and separating the landing pads, first passage patterns connected to the protruding insulating pattern through pad separation patterns and formed of an oxide-based insulating material, and data storage patterns disposed on the landing pads.

According to another aspect of the present disclosure, there is provided a semiconductor memory device comprising a substrate including a cell array region and a peripheral circuit region, a peripheral gate structure on the substrate, bitlines disposed on the peripheral gate structure and extending lengthwise in a first direction, a protruding insulating pattern including channel trenches, which extend in a second direction that intersects the first direction, channel structures disposed on the bitlines in the channel trenches and including a metal oxide, the channel structures including outermost channel structures, which are disposed on an outermost part of the cell array region, first wordlines disposed on the channel structures and extending lengthwise in the second direction, second wordlines disposed on the channel structures, extending lengthwise in the second direction, and spaced apart from the first wordlines in the first direction, landing pads disposed on the channel structures and connected to the channel structures, pad separation patterns disposed on the protruding insulating pattern and separating the landing pads, upper peripheral lines disposed in the peripheral circuit region of the substrate and not overlapping with the channel structures in a third direction, and cell blocking patterns disposed between the outermost channel structures and the upper peripheral lines, extending in the third direction, and formed of a nitride-based insulating material.

According to still another aspect of the present disclosure, there is provided a semiconductor memory device comprising a substrate including a cell array region and a peripheral circuit region, a peripheral gate structure on the substrate, lower peripheral lines disposed on the peripheral gate structure and connected to the peripheral gate structure, dummy peripheral lines disposed on the peripheral gate structure and not connected to the peripheral gate structure, bitlines disposed on the lower peripheral lines and the dummy peripheral lines and extending lengthwise in a first direction, bitline plugs connecting the bitlines and the lower peripheral lines in the peripheral circuit region, dummy bitline plugs connecting the bitlines and the dummy peripheral lines in the peripheral circuit region, a protruding insulating pattern including channel trenches, which extend in a second direction that intersects the first direction, the channel trenches being disposed on a cell array region of the substrate, channel structures disposed on the bitlines in the channel trenches and including a metal oxide, first wordlines disposed on the channel structures and extending lengthwise in the second direction, second wordlines disposed on the channel structures, extending lengthwise in the second direction, and spaced apart from the first wordlines in the first direction, landing pads disposed on the channel structures and connected to the channel structures, pad separation patterns disposed on the protruding insulating pattern and separating the landing pads, and capacitors disposed on the landing pads.

BRIEF DESCRIPTION OF THE DRAWINGS

The above and other aspects and features of the present disclosure will become more apparent by describing in detail exemplary embodiments thereof with reference to the attached drawings, in which like numerals refer to like elements throughout. In the drawings.

DETAILED DESCRIPTION

It will be understood that, although the terms "first," "second," "upper," "lower," and the like may be used herein to describe various elements, these elements should not be limited by these terms. These terms are only used to distinguish one element from another. Thus, a "first" element discussed below could also be termed a "second" element without departing from the teachings of the present disclosure. Similarly, a "lower" element discussed below could also be termed an "upper element" without departing from the teachings of the present disclosure.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Figure 1:
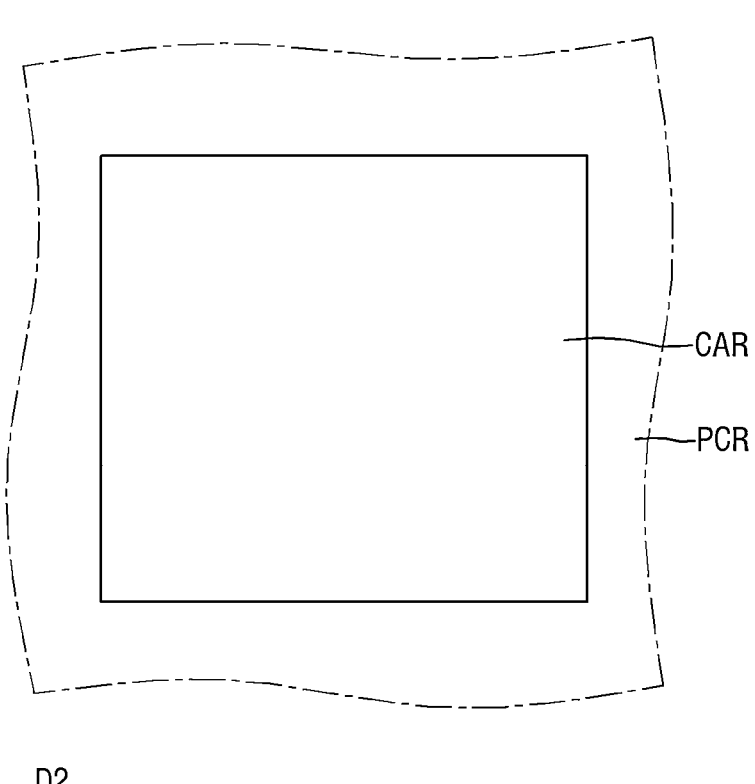
FIG. 1 is a layout view of a semiconductor memory device according to example embodiments of the present disclosure.
Figure 2:
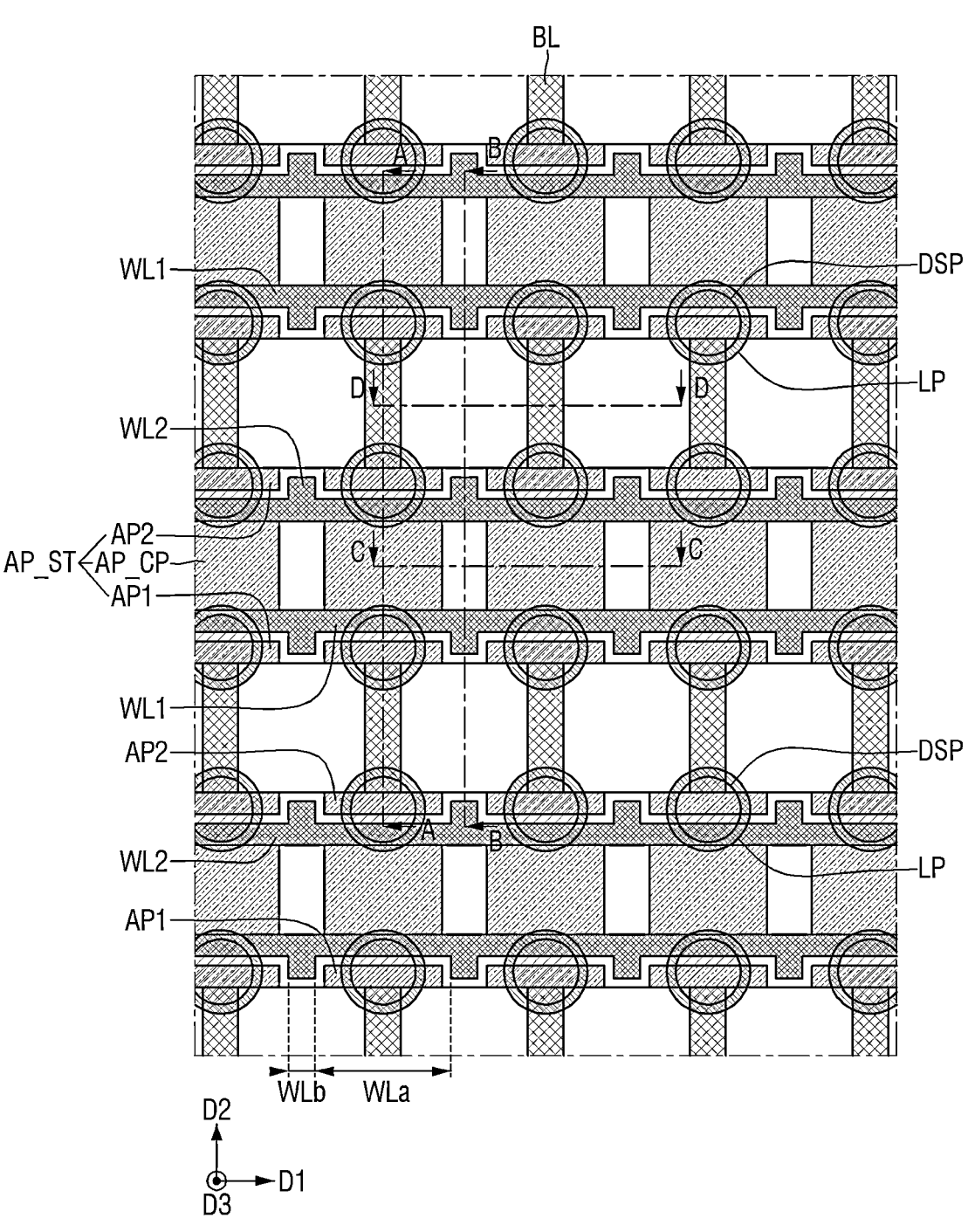
FIG. 2 is a plan view of a cell array region of FIG. 1.
Figure 3:
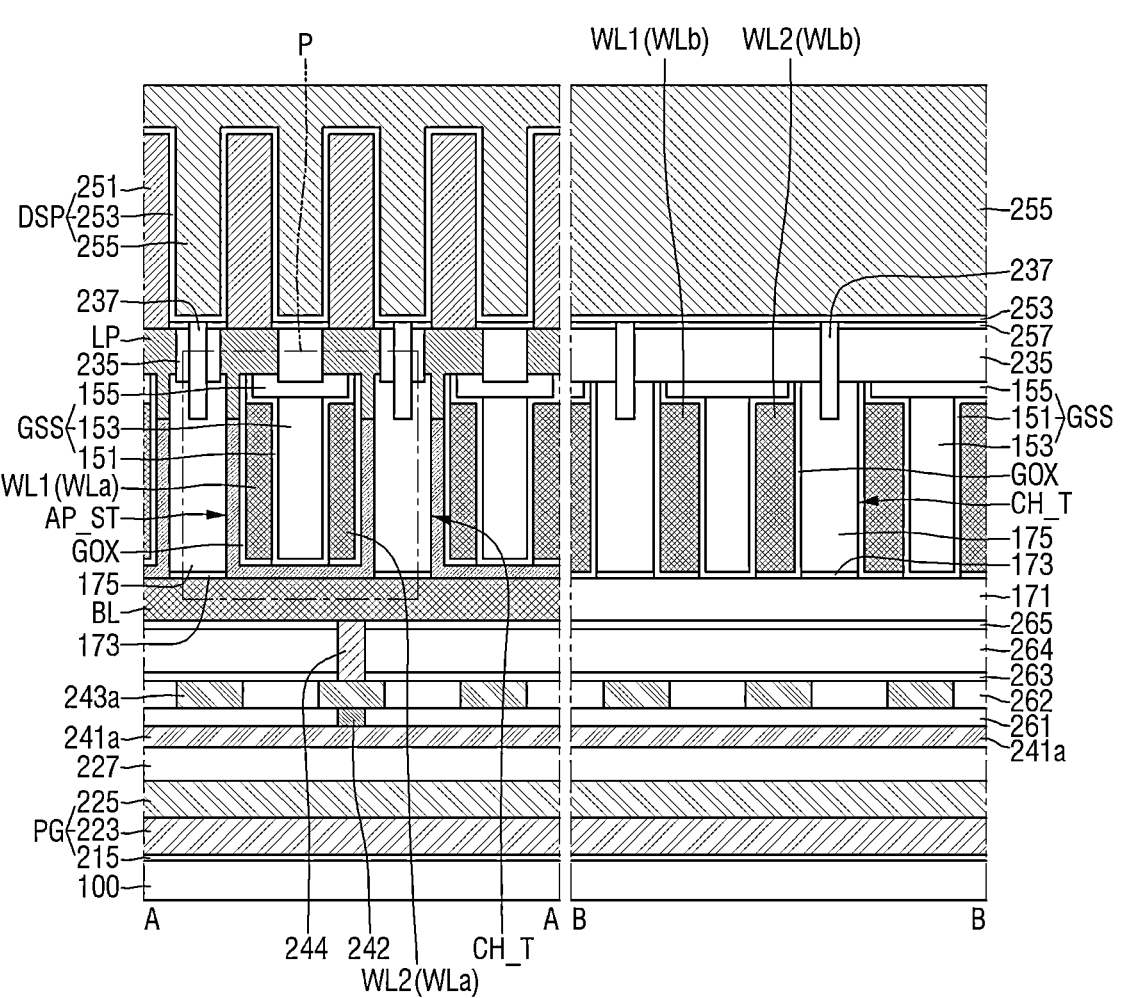
FIG. 3 is a cross-sectional view taken along lines A-A and B-B of FIG. 2.
Figure 4:
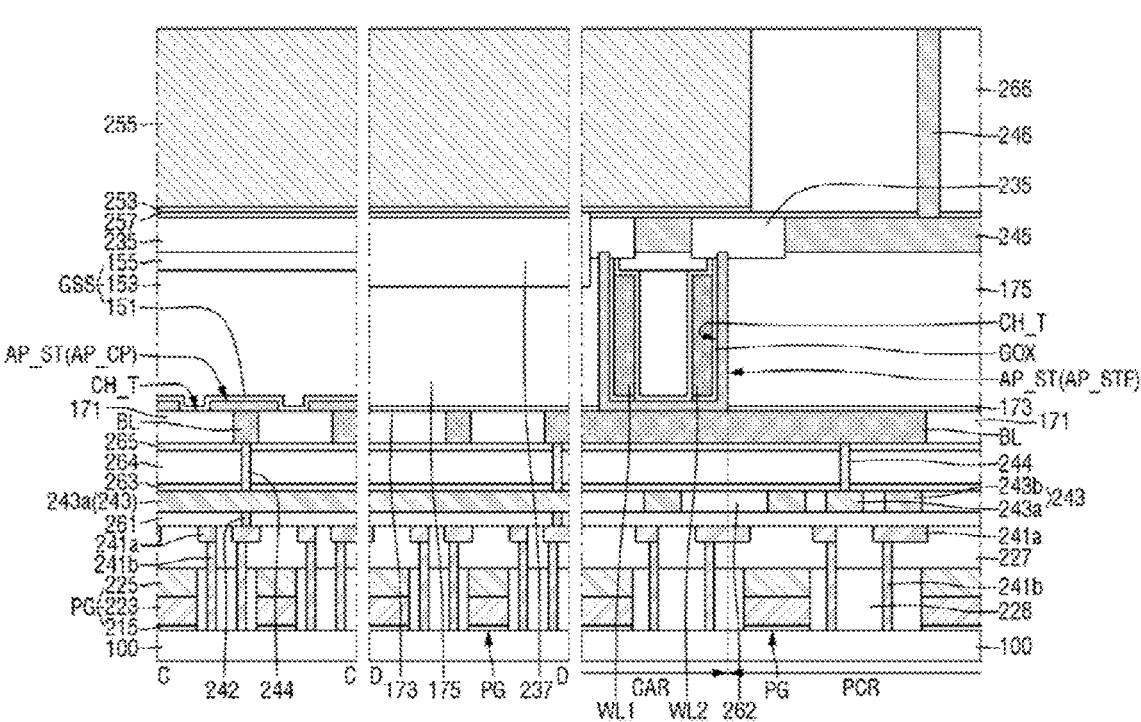
FIG. 4 is a cross-sectional view taken along lines C-C and D-D of FIG. 2.
Figure 5:
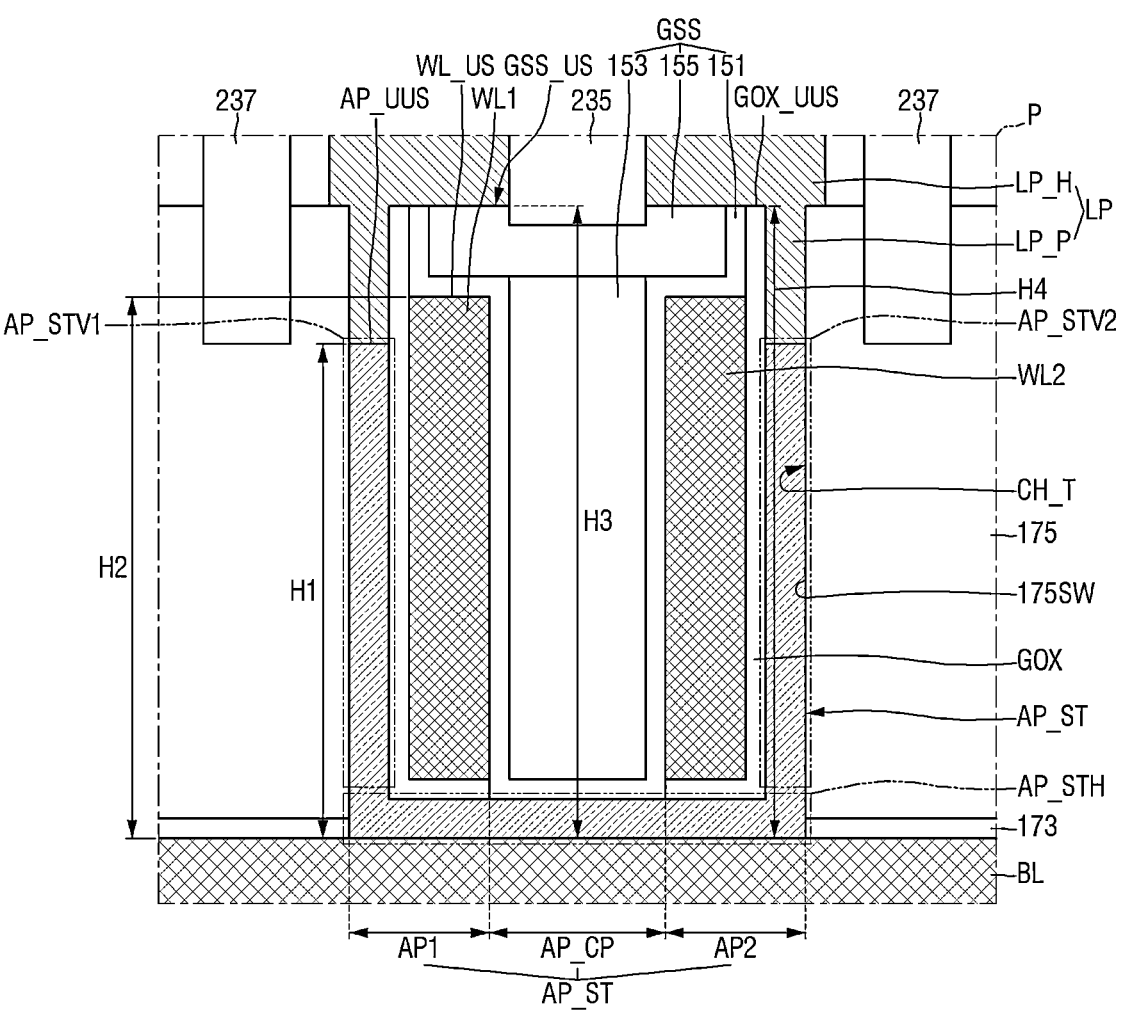
FIGS. 5 to 7 are enlarged cross-sectional views of part P of FIG. 3.
Figure 6:
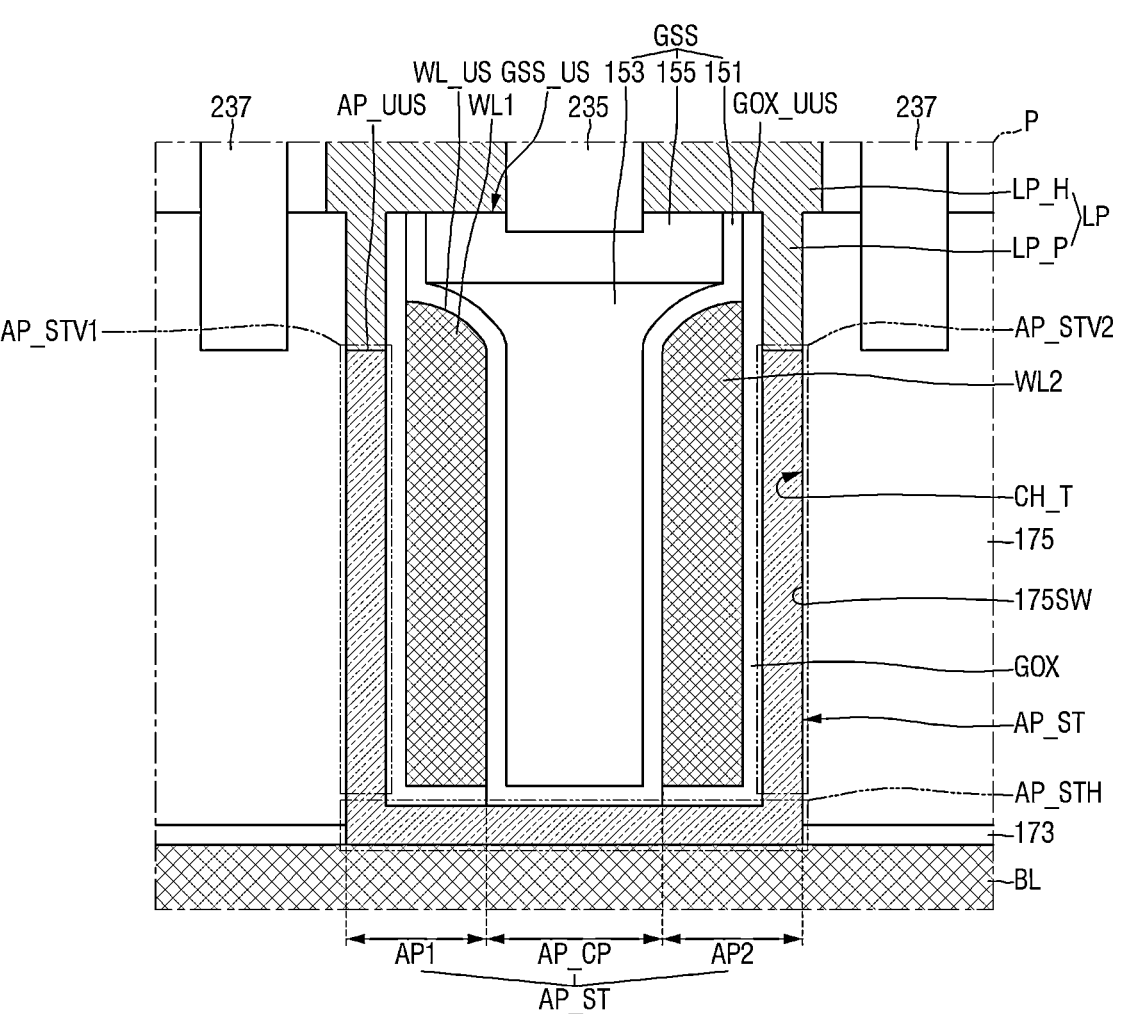
Figure 7:
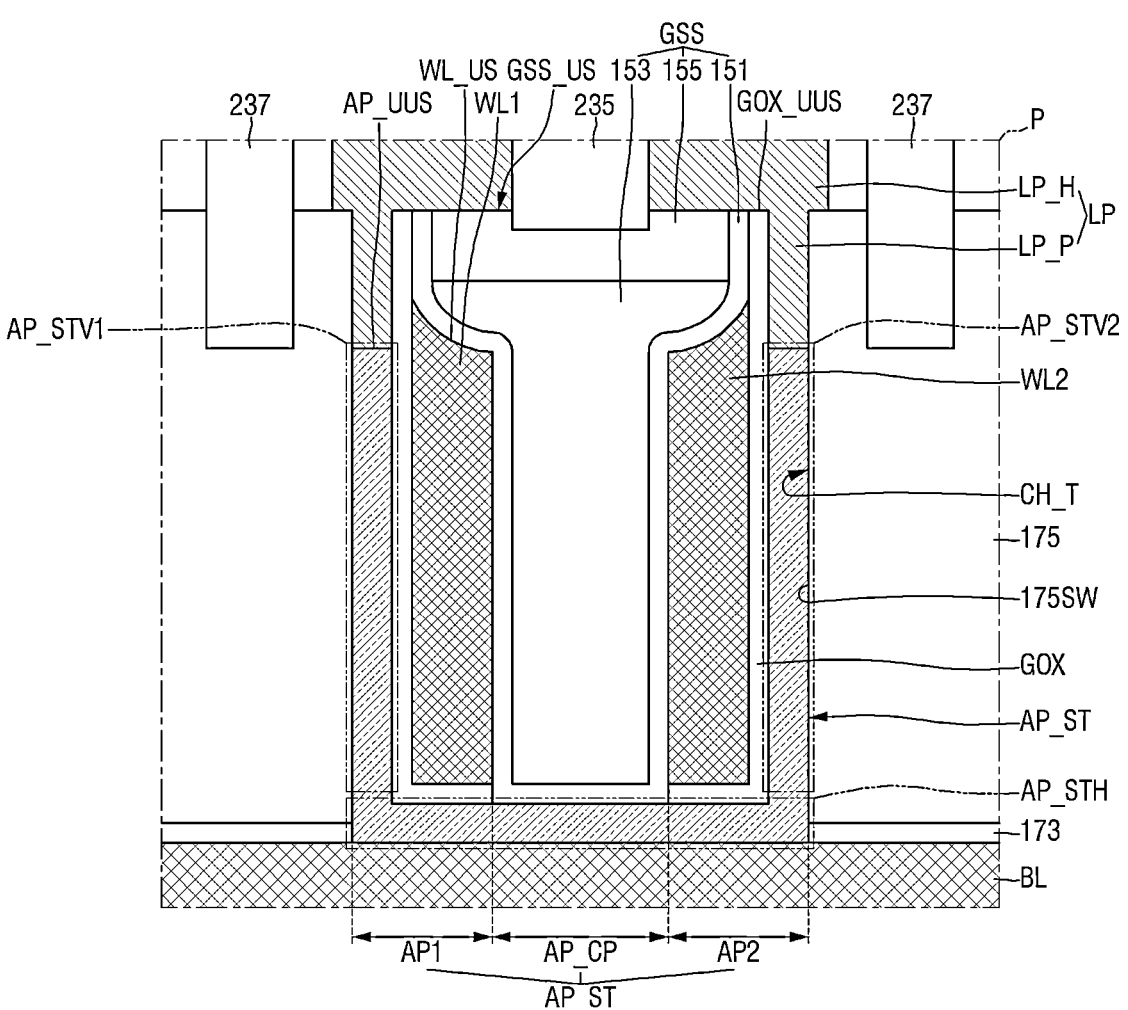

FIG. 1 is a layout view of a semiconductor memory device according to example embodiments of the present disclosure. FIG. 2 is a plan view of a cell array region of FIG. 1. FIG. 3 is a cross-sectional view taken along lines A-A and B-B of FIG. 2. FIG. 4 is a cross-sectional view taken along lines C-C and D-D of FIG. 2. FIGS. 5 to 7 are enlarged cross-sectional views of part P of FIG. 3.

For reference, FIG. 4 includes cross-sectional views of a peripheral circuit region, which borders the cell array region of FIG. 1. The cross-sectional views of a peripheral circuit region of FIG. 4 may be cross-sectional views cutting a bit line in a direction in which bitlines extend. That is, in FIG. 4, cross-sectional views taken along lines C-C and D-D illustrates a cross-sectional view taken along a first direction D1, and cross-sectional views of peripheral circuit region illustrates a cross-sectional view taken along a second direction D2.

The semiconductor memory device according to example embodiments may include memory cells, which include vertical channel transistors (VCTs).

Referring to FIGS. 1 to 7, the semiconductor memory device may include a peripheral gate structure PG, bitlines BL, wordlines (WL1 and WL2), channel structures AP_ST, a protruding insulating pattern 175, first passage patterns 237, and data storage patterns DSP.

A substrate 100 may include a cell array region CAR and a peripheral circuit region PCR. Memory cells may be disposed on the substrate 100 in the cell array region CAR.

The substrate 100 may be a silicon (Si) substrate or may include a material other than Si, such as silicon germanium, indium antimonide, lead tellurium compound, indium arsenide, indium phosphide, gallium arsenide, or gallium antimonide, but the present disclosure is not limited thereto.

The peripheral gate structure PG may be disposed on the substrate 100. The peripheral gate structure PG may be disposed across the cell array region CAR and the peripheral circuit region PCR. In other words, a portion of the peripheral gate structure PG may be disposed in the cell array region CAR, and the remainder of the peripheral gate structure PG may be disposed in the peripheral circuit region PCR.

The peripheral gate structure PG may be included in a sensing transistor, a transfer transistor, and a driving transistor. For example, the peripheral gate structure PG included in the sensing transistor may be disposed on the substrate 100 in the cell array region CAR, but the present disclosure is not limited thereto. The type of transistor of a peripheral circuit on the substrate 100 in the cell array region CAR, may vary depending on the design layout of the semiconductor memory device.

The peripheral gate structure PG may include a peripheral gate insulating film 215, a peripheral lower conductive pattern 223, and a peripheral upper conductive pattern 225. The peripheral gate insulating film 215 may include a silicon oxide film, a silicon oxynitride film, a high-k dielectric film having a greater dielectric constant than a silicon oxide film, or a combination thereof. The high-k insulating film may include, for example, at least one of a metal oxide, a metal oxynitride, a metal silicon oxide, and a metal silicon oxynitride, but the present disclosure is not limited thereto.

The peripheral lower conductive pattern 223 and the peripheral upper conductive pattern 225 may include a conductive material. For example, the peripheral lower conductive pattern 223 and the peripheral upper conductive pattern 225 may include at least one of a doped semiconductor material, a conductive metal nitride, a conductive metal silicon nitride, a metal carbonitride, a conductive metal silicide, a conductive metal oxide, a two-dimensional (2D) material, a metal, and a metal alloy. The peripheral gate structure PG is illustrated as including a plurality of conductive patterns, but the present disclosure is not limited thereto.

In a semiconductor memory device according to some embodiments, the 2D material may be a metallic material and/or a semiconductor material. The 2D material may include a 2D allotrope or a 2D compound. For example, the 2D material may include at least one of graphene, molybdenum disulfide ($MoS_2$), molybdenum diselenide ($MoSe_2$), tungsten diselenide ($WSe_2$), and tungsten disulfide ($WS_2$), but the present disclosure is not limited thereto. That is, the above-described 2D materials are merely examples, and the present disclosure is not limited thereto.

A first peripheral lower insulating film 227 and a second peripheral lower insulating film 228 are disposed on the substrate 100. The first peripheral lower insulating film 227 and the second peripheral lower insulating film 228 may be formed of an insulating material.

First lower peripheral lines 241a and lower peripheral contact plugs 241b may be disposed in the first peripheral lower insulating film 227 and the second peripheral lower insulating film 228. The first lower peripheral lines 241a and the lower peripheral contact plugs 241b are illustrated as being different films, but the present disclosure is not limited thereto. Alternatively, the boundaries between the first lower peripheral lines 241a and the lower peripheral contact plugs 241b may not be distinguished. The first lower peripheral lines 241a and the lower peripheral contact plugs 241b may include a conductive material.

A first peripheral upper insulating film 261 and a second peripheral upper insulating film 262 may be disposed on the first lower peripheral lines 241a and the lower peripheral contact plugs 241b. The first peripheral upper insulating film 261 and the second peripheral upper insulating film 262 may be formed of an insulating material.

Second lower peripheral lines 243 and lower peripheral via plugs 242 are disposed on the first lower peripheral lines 241a. For example, lower surfaces of the lower peripheral via plugs 242 may contact upper surfaces of the first lower peripheral lines 241a and upper surfaces of the lower peripheral via plugs 242 may contact lower surfaces of the second lower peripheral lines 243. The lower peripheral via plugs 242 may be disposed in the first peripheral upper insulating film 261. The second lower peripheral lines 243 may be disposed in the second peripheral upper insulating film 262.

The second lower peripheral lines 243 may include second lower normal lines 243a and second lower dummy lines 243b. The second lower normal lines 243a may be disposed in the cell array region CAR and the peripheral circuit region PCR. The second lower dummy lines 243b are illustrated as being disposed on both sides of each of the second lower normal lines 243a, but the present disclosure is not limited thereto. Two second lower dummy lines 243b may be provided, but the number of second lower dummy lines 243b is not particularly limited thereto.

The second lower dummy lines 243b may be disposed in the peripheral circuit region PCR, but the present disclosure is not limited thereto. Alternatively, the second lower dummy lines 243b may also be disposed in the cell array region CAR depending on the design rule of the semiconductor memory device and the integration density of the second lower peripheral lines 243.

The second lower normal lines 243a and the lower peripheral via plugs 242 may be connected to the first lower peripheral lines 241a. The lower peripheral via plugs 242 may connect the first lower peripheral lines 241a and the second lower normal lines 243a. The second lower peripheral lines 243 and the lower peripheral via plugs 242 may include a conductive material. The second lower peripheral lines 243 and the lower peripheral via plugs 242 are illustrated as being separate films, but the present disclosure is not limited thereto. The boundaries between the second lower peripheral lines 243 and the lower peripheral via plugs 242 may not be distinguished.

A third peripheral upper insulating film 263, a fourth peripheral upper insulating film 264, and a fifth peripheral upper insulating film 265 may be sequentially disposed on the second lower peripheral lines 243. Each of the third peripheral upper insulating film 263, the fourth peripheral upper insulating film 264, and the fifth peripheral upper insulating film 265 may be formed of an insulating material.

The fourth peripheral upper insulating film 264 may be formed of a different insulating material from the third and fifth peripheral upper insulating films 263 and 265. For example, the fourth peripheral upper insulating film 264 may be formed of an insulating material containing a Si-based oxide, and the third and fifth peripheral upper insulating films 263 and 265 may be formed of an insulating material including a Si-based nitride. However, the present disclosure is not limited to this example.

Cell connection plugs 244 may be disposed in the third, fourth, and fifth peripheral upper insulating films 263, 264, and 265. The cell connection plugs 244 may be connected to the second lower peripheral lines 243. The cell connection plugs 244 may include a conductive material. In example embodiments, a height of the cell connection plugs 244 in the third direction D3 may be the same as a sum of the heights of the third, fourth, and fifth peripheral upper insulating films 263, 264, and 265.

The bitlines BL are disposed on the peripheral gate structure PG. More specifically, the bitlines BL may be disposed on the fifth peripheral upper insulating film 265. For example, the bitlines BL may be in contact with the fifth peripheral upper insulating film 265.

The bitlines BL may extend lengthwise in the second direction D2. The bitlines Bl adjacent to each other may be spaced apart in the first direction D1. Each of the bitlines BL may have long sidewalls that extend in the second direction D2 and short sidewalls that extend in the first direction D1.

The bitlines BL may extend from the cell array region CAR into the peripheral circuit region PCR. The ends of the bitlines BL may be disposed in the peripheral circuit region PCR. A portion of the bitlines BL may be disposed at a position overlapping the peripheral circuit region PCR.

The bitlines BL may be disposed on the cell connection plugs 244. The bitlines BL may be connected to the cell connection plugs 244. For example, some of the bitlines BL may be connected to the cell connection plugs 244 in the cell array region CAR, and the other bitlines BL may be connected to the cell connection plugs 244 in the peripheral circuit region PCR. Unlike what is illustrated, the bitlines BL may be connected to the cell connection plugs 244 in the peripheral circuit region PCR in another example. In still another example, the bitlines BL may be connected to the cell connection plugs 244 in the cell array region CAR.

The bitlines BL may include a conductive material such as a doped semiconductor material, a conductive metal nitride, a conductive metal silicon nitride, a metal carbonitride, a conductive metal silicide, a conductive metal oxide, a 2D material, a metal, and a metal alloy. The bitlines BL are illustrated as being single-layer films, but the present disclosure is not limited thereto.

A cell lower insulating film 171 may be disposed on the fifth peripheral upper insulating film 265. The cell lower insulating film 171 may be disposed between the bitlines BL, which are spaced apart in the first direction D1. The cell lower insulating film 171 may be formed of an insulating material.

The protruding insulating pattern 175 is disposed on the bitlines BL and the cell lower insulating film 171. The protruding insulating pattern 175 may be disposed across the cell array region CAR and the peripheral circuit region PCR. A cell lower etch stopper film 173 may be disposed between the protruding insulating pattern 175 and the cell lower insulating film 171.

The protruding insulating pattern 175 and the cell lower etch stopper film 173 may be formed of an insulating material. The cell lower etch stopper film 173 may include a material having an etching selectivity with respect to the protruding insulating pattern 175. For example, the protruding insulating pattern 175 may be formed of an insulating material including a Si-based oxide, but the present disclosure is not limited thereto. Unlike what is illustrated, the cell lower etch stopper film 173 may not be disposed between the protruding insulating pattern 175 and the cell lower insulating film 171.

The protruding insulating pattern 175 may include a plurality of channel trenches CH_T. The channel trenches CH_T may extend lengthwise in the first direction D1. The channel trenches CH_T adjacent to each other may be spaced apart in the second direction D2. The channel trenches CH_T may be disposed in the cell array region CAR.

The channel trenches CH_T may intersect the bitlines BL. Each of the channel trenches CH_T may expose multiple bitlines BL adjacent to one another in the first direction D1.

The bottom surfaces of the channel trenches CH_T may be defined by the bitlines BL and the cell lower insulating film 171. The sidewalls of each of the channel trenches CH_T may be defined by the protruding insulating pattern 175 and the cell lower etch stopper film 173. At least a portion of the sidewalls of each of the channel trenches CH_T may be sidewalls 175SW of the protruding insulating pattern 175. In a case where the cell lower etch stopper film 173 is not disposed, the sidewalls of each of the channel trenches CH_T may be defined by the protruding insulating pattern 175.

The channel structures AP_ST may be disposed on the bitlines BL. A plurality of channel structures AP_ST may be connected to each of the bitlines BL and may be spaced apart from one another in the second direction D2.

The channel structures AP_ST may be disposed in the channel trenches CH_T, which extend lengthwise in the first direction D1. The plurality of channel structures AP_ST may be disposed in each of the channel trenches CH_T and may be spaced apart in the first direction D1.

For example, the channel structures AP_ST may be arranged two-dimensionally in the first and second directions D1 and D2, which intersect each other.

The channel structures AP_ST may extend along the sidewalls and the bottom surface of each of the channel trenches CH_T. In a cross-sectional view taken along the second direction D2, the channel structures AP_ST may have a "U" shape.

The channel structures AP_ST may include outermost channel structures AP_STE, which are disposed in the outermost part of the cell array region CAR. In FIG. 4, the boundaries between the cell array region CAR and the peripheral circuit region PCR may be distinguished by an outermost channel structures AP_STE. That is, the cell array region CAR may be a region where the channel structures AP_ST are disposed, and the peripheral circuit region PCR may be a region where the channel structures AP_ST are not disposed.

The outermost channel structures AP_STE are illustrated as not being connected to the data storage patterns DSP, but the present disclosure is not limited thereto. Unlike what is illustrated, the outermost channel structures AP_STE may be connected to the data storage patterns DSP through landing pads LP.

The channel structures AP_ST include horizontal portions AP_STH, first vertical portions AP_STV1, and second vertical portions AP_STV2. The first vertical portions AP_STV1 and the second vertical portions AP_STV2 of the channel structures may protrude from the horizontal portions AP_STH in a third direction D3. In example embodiments, the first vertical portions AP_STV1 and the second vertical portions AP_STV2 of the channel structures may extend in parallel with one another.

The horizontal portions AP_STH may extend along the bottom surfaces of the channel trenches CH_T. In a cross-sectional view taken along the second direction D2, the horizontal portions AP_STH of the channel structures may extend along the upper surfaces of the bitlines BL. The horizontal portions AP_STH of the channel structures are connected to the bitlines BL. For example, the horizontal portions AP_STH of the channel structures may be in contact with the upper surfaces of the bitlines BL.

The first vertical portions AP_STV1 of the channel structures and the second vertical portions AP_STV2 of the channel structures may extend along the sidewalls of each of the channel trenches CH_T. In a cross-sectional view taken along the second direction D2, the first vertical portions AP_STV1 of the channel structures and the second vertical portions AP_STV2 of the channel structures may extend along the sidewalls 175SW of the protruding insulating pattern 175.

The channel structures AP_ST may include an oxide semiconductor material. The channel structures AP_ST may include, for example, a metal oxide. As an example, the channel structures AP_ST may be amorphous metal oxide films. In another example, the channel structures AP_ST may be polycrystalline metal oxide films. In still another example, the channel structures AP_ST may be combinations of amorphous metal oxide films and polycrystalline metal oxide films. In still another example, the channel structures AP_ST may be C-axis aligned crystalline (CAAC) metal oxide films.

The channel structures AP_ST may include, for example, one of indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide (IGO), In—Ga—Zn-based oxide (IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—

Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide, but the present disclosure is not limited thereto.

Here, the term "In—Ga—Zn-based oxide" denotes an oxide having In, Ga, and Zn as its main components, but does not necessarily mean the ratio of In, Ga, and Zn. Thus, taking In—Ga—Zn oxide (IGZO) as an example, the channel structures AP_ST may include In—Ga—Zn oxide (IGZO), i.e., InxGayZnzO. IGZO having an In:Ga:Zn ratio of 1:1:1 may be an In—Ga—Zn-based oxide. Ga-rich IGZO may have a greater Ga ratio than IGZO having an In:Ga:Zn ratio of 1:1:1, but a less In ratio than IGZO having an In:Ga:Zn ratio of 1:1:1. Ga-rich IGZO may also be an In—Ga—Zn-based oxide. In-rich IGZO may have a greater In content than IGZO having an In:Ga:Zn ratio of 1:1:1, but a less Ga content than IGZO having an In:Ga:Zn ratio of 1:1:1. In-rich IGZO may also be an In—Ga—Zn-based oxide.

The oxides that may be used to form the channel structures AP_ST have been described, taking the In—Ga—Zn-based oxide as an example, but the above description of the In—Ga—Zn-based oxide may be directly applicable to a case where the channel structures AP_ST include a ternary (or higher) metal oxide. In a case where the channel structures AP_ST include the In—Ga—Zn-based oxide, the channel structures AP_ST may further include a doped metal element in addition to In, Ga, and Zn.

The channel structures AP_ST may include first channel patterns AP1, second channel patterns AP2, and connecting channel patterns AP_CP. The connecting channel patterns AP_CP connect the first channel patterns AP1 and the second channel patterns AP2. The first channel patterns AP1 and the second channel patterns AP2 may be spaced apart in the second direction D2. In example embodiments, a length of a connecting channel pattern AP_CP in the second direction D2 may be the distance between a corresponding first channel pattern AP1 and second channel pattern AP2 in the second direction D2.

The first channel patterns AP1, the second channel patterns AP2, and the connecting channel patterns AP_CP are disposed on the bitlines BL. The first channel patterns AP1 and the second channel patterns AP2 are connected to the bitlines BL. The first channel patterns AP1 and the second channel patterns AP2 may be in contact with the upper surfaces of the bitlines BL.

The first channel patterns AP1 may include the first vertical portions AP_STV1 of the channel structures and a portion of the horizontal portions AP_STH. The portion of the horizonal portions AP_STH may be the horizontal portions of the first channel patterns AP1. The first vertical portions AP_STV1 of the channel structures may be the vertical portions of the first channel patterns AP1.

The second channel patterns AP2 may include the second vertical portions AP_STV2 of the channel structures and another portion of the horizontal portions AP_STH. The another portion of the horizontal portions AP_STH may be the horizontal portions of the second channel patterns AP2. The second vertical portions AP_STV2 of the channel structures may be the vertical portions of the second channel patterns AP2.

The connecting channel patterns AP_CP may include the remainder of the horizontal portions AP_STH of the channel structures.

The first channel patterns AP1, the second channel patterns AP2, and the connecting channel patterns AP_CP may be distinguished from one another based on first wordlines WL1 and second wordlines WL2. In FIG. 5, the first wordlines WL1 will be taken as an example. The first wordlines WL1 may include inner sidewalls that face the sidewalls 175SW of the protruding insulating pattern 175 and outer sidewalls that are opposite to the inner sidewalls in the second direction D2. The boundaries between the first channel patterns AP1 and the connecting channel patterns AP_CP may be lines in which the outer sidewalls of the first wordlines WL1 extend in the third direction D3.

The first wordlines WL1 and the second wordlines WL2 may be disposed on the channel structures AP_ST. The first wordlines WL1 and the second wordlines WL2 may be disposed in the channel trenches CH_T.

The first wordlines WL1 and the second wordlines WL2 may extend lengthwise in the first direction D1. The first wordlines WL1 and the second wordlines WL2 may be alternately arranged in the second direction D2. The first wordlines WL1 may be spaced apart from the second wordlines WL2 in the second direction D2. In example embodiments, the distance between adjacent first and second wordlines WL1 and WL2 in the second direction D2 may be the same as the length of a connecting channel pattern AP_CP in the second direction D2.

The first wordlines WL1 and the second wordlines WL2 may be spaced apart from the bitlines BL in the third direction D3. The first wordlines WL1 and the second wordlines WL2 may intersect the bitlines BL.

The first wordlines WL1 and the second wordlines WL2 may be disposed on the horizontal portions AP_STH of the channel structures AP_ST. The first wordlines WL1 and the second wordlines WL2 may be disposed between the first vertical portions AP_STV1 of the channel structures and the second vertical portions AP_STV2 of the channel structures.

The first wordlines WL1 are disposed on the first channel patterns AP1. The second wordlines WL2 are disposed on the second channel patterns AP2. The first wordlines WL1 and the second wordlines WL2 are disposed between the first channel patterns AP1 and the second channel patterns AP2. The first channel patterns AP1 may be closer to the first wordlines WL1 than to the second wordlines WL2. The second channel patterns AP2 may be closer to the second wordlines WL2 than to the first wordlines WL1.

The first wordlines WL1 and the second wordlines WL2 may have a width in the second direction D2. The width of the first wordlines WL1 in areas that overlap with the channel structures AP_ST in the third direction D3 may be different with the width of the first wordlines WL1 in areas that do not overlap with the channel structures AP_ST. The width of the second wordlines WL2 in areas that overlap with the channel structures AP_ST in the third direction D3 may be different with the width of the second wordlines WL2 in areas that do not overlap with the channel structures AP_ST.

For example, each of the wordlines (WL1 and WL2) may include first portions WLa and second portions WLb. The width, in the second direction D2, of the first portions WLa of each of the wordlines (WL1 and WL2) may be less than the width, in the second direction D2, of the second portions WLb of each of the wordlines (WL1 and WL2). For example, the first portions WLa of each of the wordlines (WL1 and WL2) may be disposed on the channel structures AP_ST. The first portions WLa of each of the wordlines (WL1 and WL2) may be disposed on the first channel patterns AP1 and the second channel patterns AP2.

Each of the wordlines (WL1 and WL2) may include first portions WLa and second portions WLb that are alternately arranged in the first direction D1. Each of the channel structures AP_ST may be disposed between second portions WLb of adjacent wordlines (WL1 and WL2) in the first direction D1. Each of the first channel patterns AP1 may be disposed between second portions WLb of adjacent first wordlines WL1 in the first direction D1. Each of the second channel patterns AP2 may be disposed between second portions WLb of adjacent second wordlines WL2 in the first direction D1.

The channel structures AP_ST are not disposed below the second portions WLb of each of the wordlines (WL1 and WL2). The height of the first portions WLa of each of the wordlines (WL1 and WL2) may be less than the height of the second portions WLb of each of the wordlines (WL1 and WL2). For example, the difference between the height of the first portions WLa of each of the wordlines (WL1 and WL2) and the height of the second portions WLb of each of the wordlines (WL1 and WL2) may be the same as the thickness of the channel structures AP_ST in the third direction D3.

The first wordlines WL1 and the second wordlines WL2 may include a conductive material and may include at least one of, for example, doped polysilicon, a conductive metal nitride, a conductive metal silicon nitride, a metal carbonitride, a conductive metal silicide, a conductive metal oxide, a 2D material, a metal, and a metal alloy.

Each of the wordlines (WL1 and WL2) may have an upper surface WL_US and a bottom surface, which are opposite to each other in the third direction D3. The bottom surfaces of the first wordlines WL1 and the bottom surfaces of the second wordlines WL2 may face the bitlines BL. The bottom surfaces of the first and second wordlines WL1 and WL2 may be planar.

Referring to FIG. 5, the upper surfaces WL_US of the wordlines (WL1 and WL2) may be planar. Referring to FIG. 6, the upper surfaces WL_US of the wordlines (WL1 and WL2) may be convexly rounded. Referring to FIG. 7, the upper surfaces WL_US of the wordlines (WL1 and WL2) may be concavely rounded.

The upper surfaces WL_US of the wordlines (WL1 and WL2) may be higher than uppermost parts AP_UUS of the first or second vertical portions AP_STV1 or AP_STV2 of the channel structures AP_ST with respect to the upper surfaces of the bitlines BL. The uppermost parts of the first or second channel patterns AP1 or AP2 may be the uppermost parts AP_UUS of the first or second vertical portions AP_STV1 or AP_STV2 of the channel structures AP_ST. A height H1 from the upper surfaces of the bitlines BL to the uppermost parts AP_UUS of the first or second vertical portions AP_STV1 or AP_STV2 of the channel structures AP_ST may be less than a height H2 from the upper surfaces of the bitlines BL to the upper surfaces WL_US of the wordlines (WL1 and WL2).

Referring to FIG. 5, the uppermost parts AP_UUS of the channel structures AP_ST may be lower than the upper surface of the protruding insulating pattern 175 with respect to the upper surfaces of the bitlines BL. In a semiconductor memory device according to some embodiments, the uppermost parts of the outermost channel structures AP_STE may not be lower than the upper surface of the protruding insulating pattern 175 with respect to the upper surfaces of the bitlines BL. During the manufacturing process, a portion of the channel structures AP_ST connected to the data storage patterns DSP may be removed, but the channel structures AP_ST not connected to the data storage patterns DSP may not be removed.

A gate insulating film GOX may be disposed between the first wordlines WL1 and the channel structures AP_ST and between the second lines WL2 and the channel structures AP_ST. The gate insulating film GOX may be disposed between the first wordlines WL1 and the first channel patterns AP1 and between the second wordlines WL2 and the second channel patterns AP2. The gate insulating film GOX may extend in parallel to the first wordlines WL1 and the second wordlines WL2 along the first direction D1.

The gate insulating film GOX may extend along the first vertical portions AP_STV1 of the channel structures AP_ST. The gate insulating film GOX may extend along the second vertical portions AP_STV2 of the channel structures AP_ST. In a semiconductor memory device according to some embodiments, the gate insulating film GOX may not be disposed on the horizontal portions AP_STH of the channel structures AP_ST that do not overlap with the first wordlines WL1 and the second wordlines WL2 in the third direction D3. In a cross-sectional view, parts of the gate insulating film GOX between the first wordlines WL1 and the channel structures AP_ST may be separated from parts of the gate insulating film GOX between the second wordlines WL2 and the channel structures AP_ST.

The gate insulating film GOX may include a silicon oxide film, a silicon oxynitride film, a high-k insulating film having a greater dielectric constant than a silicon oxide film, or a combination thereof.

A portion of the gate insulating film GOX may protrude beyond the upper surfaces WL_US of the wordlines (WL1 and WL2) in the third direction D3. The portion of the gate insulating film GOX may protrude beyond the uppermost parts AP_UUS of vertical portions AP_STV1 and AP_STV2 of the channel structures AP_ST in the third direction D3.

A height H4 from the upper surfaces of the bitlines BL to the uppermost parts GOX_UUS of the gate insulating film GOX may be greater than the height H1 from the upper surfaces of the bitlines BL to the uppermost parts AP_UUS of vertical portions AP_STV1 or AP_STV2 of the channel structures AP_ST. The height H4 from the upper surfaces of the bitlines BL to the uppermost parts GOX_UUS of the gate insulating film GOX may be greater than the height H2 from the upper surfaces of the bitlines BL to the upper surfaces WL_US of the wordlines (WL1 and WL2).

Gate separation patterns GSS may be disposed on the bitlines BL and the cell lower insulating film 171. The gate separation patterns GSS may be disposed in the channel trenches CH_T. The gate separation patterns GSS may be disposed on the channel structures AP_ST, the first wordlines WL1, and the second wordlines WL2.

In a semiconductor memory device according to some embodiments, the gate separation patterns GSS may be in contact with the channel structures AP_ST. The gate separation patterns GSS may be disposed on the connecting channel patterns AP_CP. The gate separation patterns GSS may be in contact with the horizontal portions AP_STH of the channel structures AP_ST. The gate separation patterns GSS may be spaced apart from the bitlines BL in the third direction D3.

Each of the gate separation patterns GSS may be disposed between first wordlines WL1 and second wordlines WL2 adjacent to each other in the second direction D2. The first wordlines WL1 and the second wordlines WL2 may be separated by the gate separation patterns GSS. The gate separation patterns GSS may extend lengthwise in the first direction D1 between the first wordlines WL1 and the second wordlines WL2.

The first wordlines WL1 may be disposed between the gate separation patterns GSS and the channel structures AP_ST. The second wordlines WL2 may be disposed between the gate separation patterns GSS and the channel structures AP_ST. The first wordlines WL1 may be disposed between the gate separation patterns GSS and the first channel patterns AP1. The second wordlines WL2 may be disposed between the gate separation patterns GSS and the second channel patterns AP2.

The gate separation patterns GSS may include horizontal portions and protruding portions. The protruding portions of the gate separation patterns GSS may protrude from the horizontal portions of the gate separation patterns GSS toward the bitlines BL in the third direction D3. The protruding portions of the gate separation patterns GSS may be closer to the bitlines BL than the horizontal portions of the gate separation patterns GSS. The horizontal portions of the gate separation patterns GSS may be disposed on the upper surfaces WL_US of the wordlines (WL1 and WL2). In a cross-sectional view, the gate separation patterns GSS may have a "T" shape.

The gate separation patterns GSS may include gate separation liners 151, gate separation filling films 153, and gate separation capping films 155. The gate separation liners 151 may extend along the upper surfaces WL_US of the wordlines (WL1 and WL2) and the outer sidewalls of the wordlines (WL1 and WL2). For example, the gate separation liners 151 may contact the upper surfaces WL_US of the wordlines (WL1 and WL2) and the outer sidewalls of the wordlines (WL1 and WL2). The gate separation liners 151 may extend along the horizontal portions AP_STH of the channel structures AP_ST. The gate separation liners 151 may be in contact with the connecting channel patterns AP_CP. The gate separation liners 151 may extend along the gate insulating film GOX, which protrudes beyond the upper surfaces WL_US of the wordlines (WL1 and WL2). The gate separation liners 151 may be in contact with side surfaces of the gate insulating film GOX. Unlike what is illustrated, the gate separation liners 151 may not extend along the gate insulating film GOX, which protrudes beyond the upper surfaces WL_US of the wordlines (WL1 and WL2).

The gate separation filling films 153 may be disposed on the gate separation liners 151. The gate separation capping films 155 may be disposed on the gate separation filling films 153. The gate separation liners 151, the gate separation filling films 153, and the gate separation capping films 155 may be formed of an insulating material. For example, the gate separation liners 151 and the gate separation capping films 155 may be formed of an insulating material including a Si-based nitride, and the gate separation filling films 153 may be formed of an insulating material including a Si-based oxide. However, the present disclosure is not limited thereto. Unlike what is illustrated, the gate separation patterns GSS may be formed as single-layer films.

With respect to the upper surfaces of the bitlines BL, upper surfaces US of the gate separation patterns GSS may be at the same height as the upper surface of the protruding insulating pattern 175, but the present disclosure is not limited thereto.

A height H3 from the upper surfaces of the bitlines BL to the upper surfaces GSS_US of the gate separation patterns GSS may be greater than the height H1 from the upper surfaces of the bitlines BL to the uppermost parts AP_UUS of vertical portions AP_STV1 or AP_STV2 of the channel structures AP_ST. The height H3 from the upper surfaces of the bitlines BL to the upper surfaces GSS_US of the gate separation patterns GSS may be greater than the height H2 from the upper surfaces of the bitlines BL to the upper surfaces WL_US of the wordlines (WL1 and WL2).

The height H3 from the upper surfaces of the bitlines BL to the upper surfaces GSS_US of the gate separation patterns GSS is illustrated as being the same as the height H4 from the upper surfaces of the bitlines BL to the uppermost parts GOX_UUS of the gate insulating film GOX, but the present disclosure is not limited thereto.

The landing pads LP may be disposed on the channel structures AP_ST. The landing pads LP may be connected to the first vertical portions AP_STV1 and the second vertical portions AP_STV2 of the channel structures AP_ST.

The landing pads LP may be disposed on the first channel patterns AP1 and the second channel patterns AP2. The landing pads LP may be connected to the first channel patterns AP1 and the second channel patterns AP2.

In a plan view, the landing pads LP may have various shapes such as a circular shape, an elliptical shape, a rectangular shape, a square shape, a rhombus shape, or a hexagonal shape. In a plan view, the landing pads LP may be arranged in a matrix form along the first direction D1 and the second direction D2.

The landing pads LP may include horizontal portions LP_H and protruding portions LP_P. The horizontal portions LP_H of the landing pads LP may be disposed on the upper surface of the protruding insulating pattern 175, the uppermost parts GOX_UUS of the gate insulating film GOX, and the upper surfaces GSS_US of the gate separation patterns GSS. For example, lower surfaces of the horizontal portions LP_H of the landing pads LP may contact the upper surface of the protruding insulating pattern 175, the uppermost parts GOX_UUS of the gate insulating film GOX, and the upper surfaces GSS_US of the gate separation patterns GSS. The protruding portions LP_P of the landing pads LP may protrude from the horizontal portions LP_H of the landing pads LP toward the bitlines BL in the third direction D3. Lower surfaces of the protruding portions LP_P may contact the uppermost parts AP_UUS of the first and second vertical portions AP_STV1 and AP_STV2 of the channel structures AP_ST.

With respect to upper surfaces of the bitlines BL, the lowermost parts of the landing patterns LP may be lower than the upper surfaces GSS_US of the gate separation patterns GSS. In other words, the protruding portions LP_P of the landing pads LP may be disposed between the protruding insulating pattern 175 and the gate separation patterns GSS. The height from the upper surfaces of the bitlines BL to the lowermost parts of the landing patterns LP may be less than the height H4 from the upper surfaces of the bitlines BL to the uppermost parts GOX_UUS of the gate insulating film GOX.

Pad separation insulating patterns 235 may be disposed between the landing pads LP. A portion of the pad separation insulating patterns 235 may be disposed in the gate separation capping films 155, but the present disclosure is not limited thereto. The upper surfaces of the landing pads LP may be on the same plane as the upper surfaces of the pad separation insulating patterns 235, but the present disclosure is not limited thereto.

The landing pads LP may include a conductive material. The landing pads LP may include, for example, at least one of doped polysilicon, a conductive metal nitride, a conductive metal silicon nitride, a metal carbonitride, a conductive metal silicide, a conductive metal oxide, a 2D material, a metal, and a metal alloy. The pad separation insulating patterns 235 may be formed of an insulating material including a Si-based nitride, but the present disclosure is not limited thereto.

A cell upper etch stopper film 257 may be disposed on the landing pads LP and the pad separation insulating patterns 235. The cell upper etch stopper film 257 may extend along the upper surfaces of the pad separation insulating patterns 235 and a portion of the upper surfaces of the landing pads LP.

The cell upper etch stopper film 257 may be formed of, for example, an insulating material including a Si-based nitride. The cell upper etch stopper film 257 may include, for example, at least one of a silicon nitride (SiN) film, a silicon carbonitride (SiCN) film, a silicon boron nitride (SiBN) film, and a silicon oxynitride (SiON) film, but the present disclosure is not limited thereto.

The first passage patterns 237 may penetrate the cell upper etch stopper film 257 and the pad separation insulating patterns 235. The first passage patterns 237 may be connected to the protruding insulating pattern 175. In example embodiments, upper surfaces of the first passage patterns 237 may be coplanar with an upper surface of the cell upper etch stopper film 257.

The first passage patterns 237 may be in contact with the protruding insulating pattern 175. The first passage patterns 237 may be in contact with a capacitor dielectric film 253.

A portion of the first passage patterns 237 are illustrated as being recessed into the protruding insulating pattern 175, but the present disclosure is not limited thereto. The first passage patterns 237 may be formed of an insulating material including a Si-based oxide. The first passage patterns 237 may be formed of, for example, silicon oxide. As the first passage patterns 237 and the protruding insulating pattern 175 are both formed of an oxide, the boundaries between the first passage patterns 237 and the protruding insulating pattern 175 may not be distinguished.

The cell upper etch stopper film 257 and the pad separation insulating patterns 235 may passivate the channel structures AP_ST. The cell upper etch stopper film 257 and the pad separation insulating patterns 235 may prevent oxygen from being diffused to a lower portion of the cell upper etch stopper film 257 and the pad separation insulating patterns 235. For example, the cell upper etch stopper film 257 and the pad separation insulating patterns 235 may block the supply of oxygen into the channel structures AP_ST.

However, the first passage patterns 237 may be used as passages for supplying oxygen. Oxygen passing through the first passage patterns 237 may move from the data storage patterns DSP to the protruding insulating pattern 175. The oxygen moved to the protruding insulating pattern 175 through the first passage patterns 237 may be supplied to the channel structures AP_ST. The oxygen is supplied to a lower portion of the cell upper etch stopper film 257 and the pad separation insulating patterns 235 through the first passage patterns 237, thereby the reliability of the channel structures AP_ST, which include a metal oxide, can be improved.

The data storage patterns DSP may be disposed on the landing pads LP. The data storage patterns DSP may be connected to the first vertical portions AP_STV1 and the second vertical portions AP_STV2 of the channel structures AP_ST. The data storage patterns DSP may be connected to the first channel patterns AP1 and the second channel patterns AP2.

The data storage patterns DSP may be arranged in a matrix form along the first direction D1 and second direction D2, as illustrated in FIG. 2. The data storage patterns DSP may completely or partially overlap with the landing pads LP in the third direction D3. The data storage patterns DSP may be in contact with the entire upper surfaces of the landing pads LP or a portion of the upper surfaces of the landing pads LP.

As an example, the data storage patterns DSP may be capacitors. The first channel patterns AP1 may be connected to first capacitors. The second channel patterns AP2 may be connected to second capacitors.

The data storage patterns DSP may include the capacitor dielectric film 253, which is interposed between storage electrodes 251 and a plate electrode 255. In this case, the storage electrodes 251 may be in contact with the landing pads LP. In a plan view, the storage electrodes 251 may be various shapes such as a circular shape, an elliptical shape, a rectangular shape, a square shape, a rhombus shape, or a hexagonal shape. The data storage patterns DSP may completely or partially overlap with the landing pads LP. The data storage patterns DSP may be in contact with the entire upper surfaces of the landing pads LP or a portion of the upper surfaces of the landing pads LP. The storage electrodes 251 may penetrate the cell upper etch stopper film 257. In example embodiments, the capacitor dielectric film 253 may contact upper surfaces of the first passage patterns 237.

Alternatively, the data storage patterns DSP may be variable resistance patterns that can be switched into two resistance states by electrical pulses applied to memory elements. For example, the data storage patterns DSP may include a phase-change material whose crystalline state changes in accordance with the amount of current, a perovskite compound, a transition metal oxide, a magnetic material, a ferromagnetic material, or an antiferromagnetic material.

Upper peripheral lines 245 may be disposed in the peripheral circuit region PCR. The upper peripheral lines 245 may not overlap with the channel structures AP_ST in the third direction D3.

The upper peripheral lines 245 may be disposed on the protruding insulating pattern 175. The cell upper etch stopper film 257 may extend along the upper surfaces of the upper peripheral lines 245.

The upper peripheral lines 245 may be electrically connected to the peripheral gate structure PG. Although not illustrated, the upper peripheral lines 245 may be connected to the data storage patterns DSP. For example, the height from the upper surfaces of the bitlines BL to the upper surfaces of the upper peripheral lines 245 may be the same as the height from the upper surfaces of the bitlines BL to the upper surfaces of the landing pads LP. The upper surfaces of the upper peripheral lines 245 may be on the same plane as the upper surfaces of the landing pads LP.

A sixth peripheral upper insulating film 266 may be disposed on the upper peripheral lines 245. The sixth peripheral upper insulating film 266 may cover the sidewalls of the plate electrode 255. The sixth peripheral upper insulating film 266 may be formed of an insulating material.

Upper peripheral contact plugs 246 may be disposed in the sixth peripheral upper insulating film 266. The upper peripheral contact plugs 246 may be connected to the upper peripheral lines 245. The upper peripheral contact plugs 246 and the upper peripheral lines 245 may include a conductive material.

Figure 8:
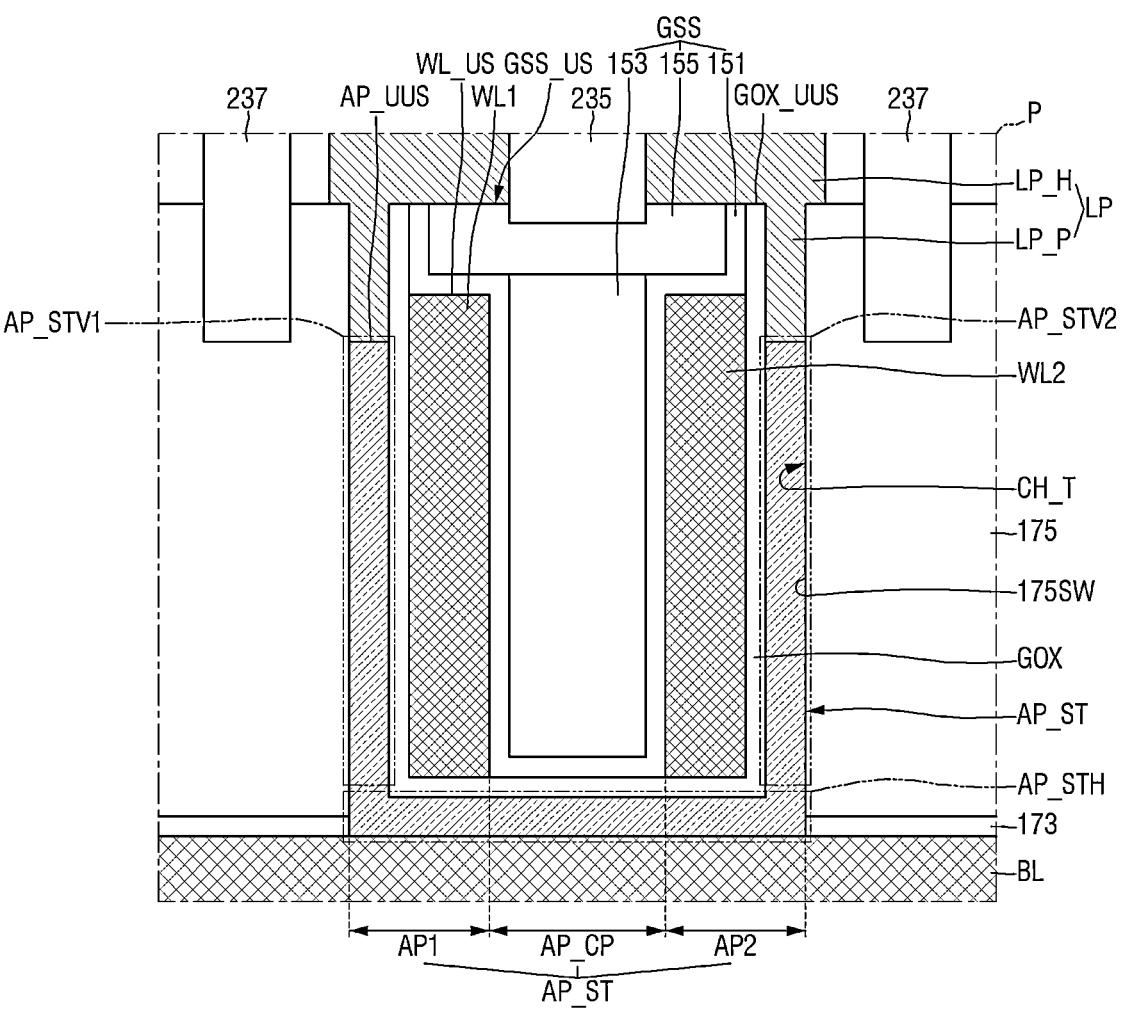
FIG. 8 is a cross-sectional view of a semiconductor memory device according to example embodiments of the present disclosure.
Figure 9:
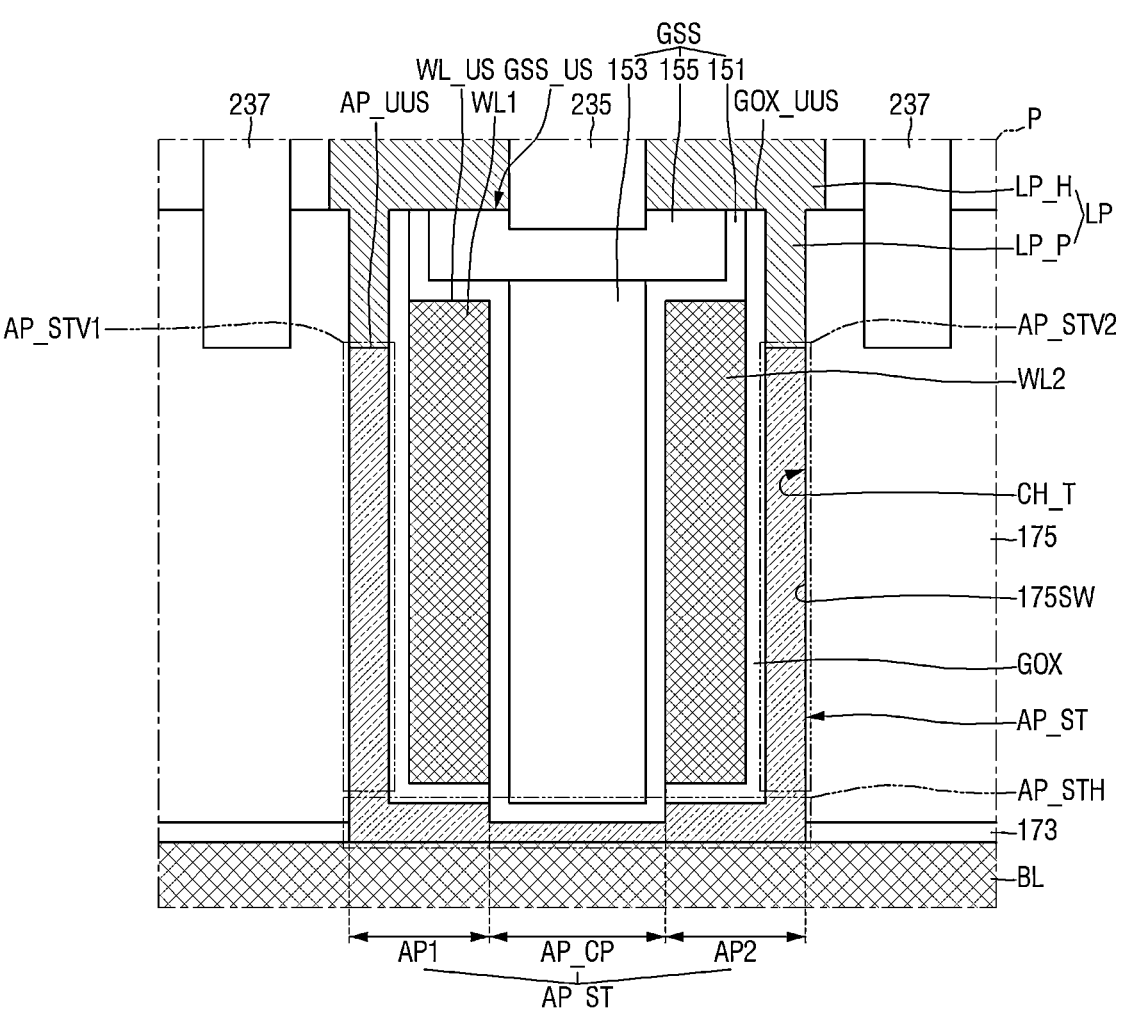
FIG. 9 is a cross-sectional view of a semiconductor memory device according to example embodiments of the present disclosure.
Figure 10:
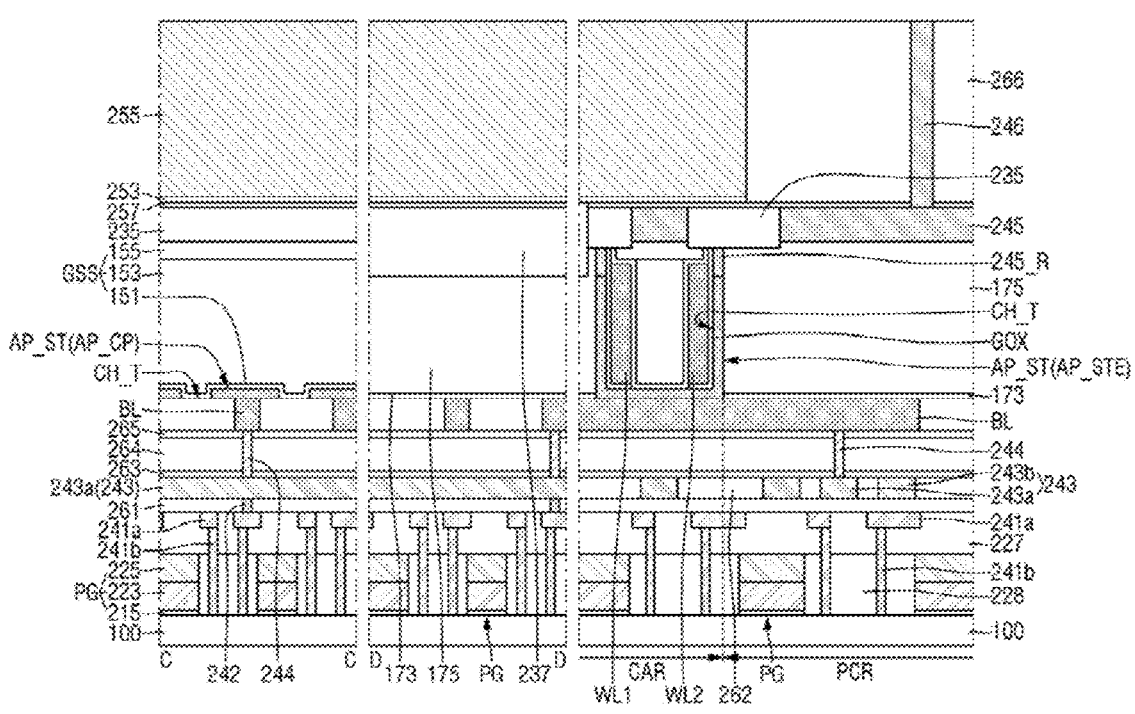
FIG. 10 is a cross-sectional view of a semiconductor memory device according to example embodiments of the present disclosure.

FIG. 8 is a cross-sectional view of a semiconductor memory device according to example embodiments of the present disclosure. FIG. 9 is a cross-sectional view of a semiconductor memory device according to example embodiments of the present disclosure. FIG. 10 is a cross-sectional view of a semiconductor memory device according to example embodiments of the present disclosure. For convenience, the embodiments of FIGS. 8 to 10 will hereinafter be described, focusing mainly on the differences with the embodiment of FIGS. 1 to 7.

For reference, FIGS. 8 and 9 are enlarged views of part P of FIG. 3. FIG. 10 illustrates cross-sectional views taken along lines C-C and D-D of FIG. 2.

Referring to FIG. 8, gate separation patterns GSS may not be in contact with channel structures AP_ST.

A portion of a gate insulating film GOX may be disposed between the gate separation patterns GSS and the channel structures AP_ST. In a cross-sectional view, parts of the gate insulating film GOX between first wordlines WL1 and the channel structures AP_ST may be connected to the gate insulating film GOX between second wordlines WL2 and the channel structures AP_ST.

Referring to FIG. 9, in a semiconductor memory device according to example embodiments a portion of gate separation patterns GSS may be recessed into channel structures AP_ST.

The thickness in the third direction D3 of connecting channel patterns AP_CP may be less than the thickness in the third direction D3 of horizontal portions AP_STH of the channel structures AP_ST, which are included in first channel patterns AP1 and second channel patterns AP2.

Referring to FIG. 10, the uppermost parts of outermost channel structures AP_STE may be lower than the upper surface of a protruding insulating pattern 175 with respect to the upper surfaces of bitlines BL.

During the manufacturing process, while a portion of channel structures AP_ST connected to data storage patterns DSP is removed, a portion of channel structures AP_ST not connected to the data storage patterns DSP may also be removed.

Conductive film residues 245_R, which may correspond to the protruding portions LP_P of the landing pads LP of FIG. 5, may be disposed between a gate insulating film GOX and the protruding insulating pattern 175.

Figure 11:
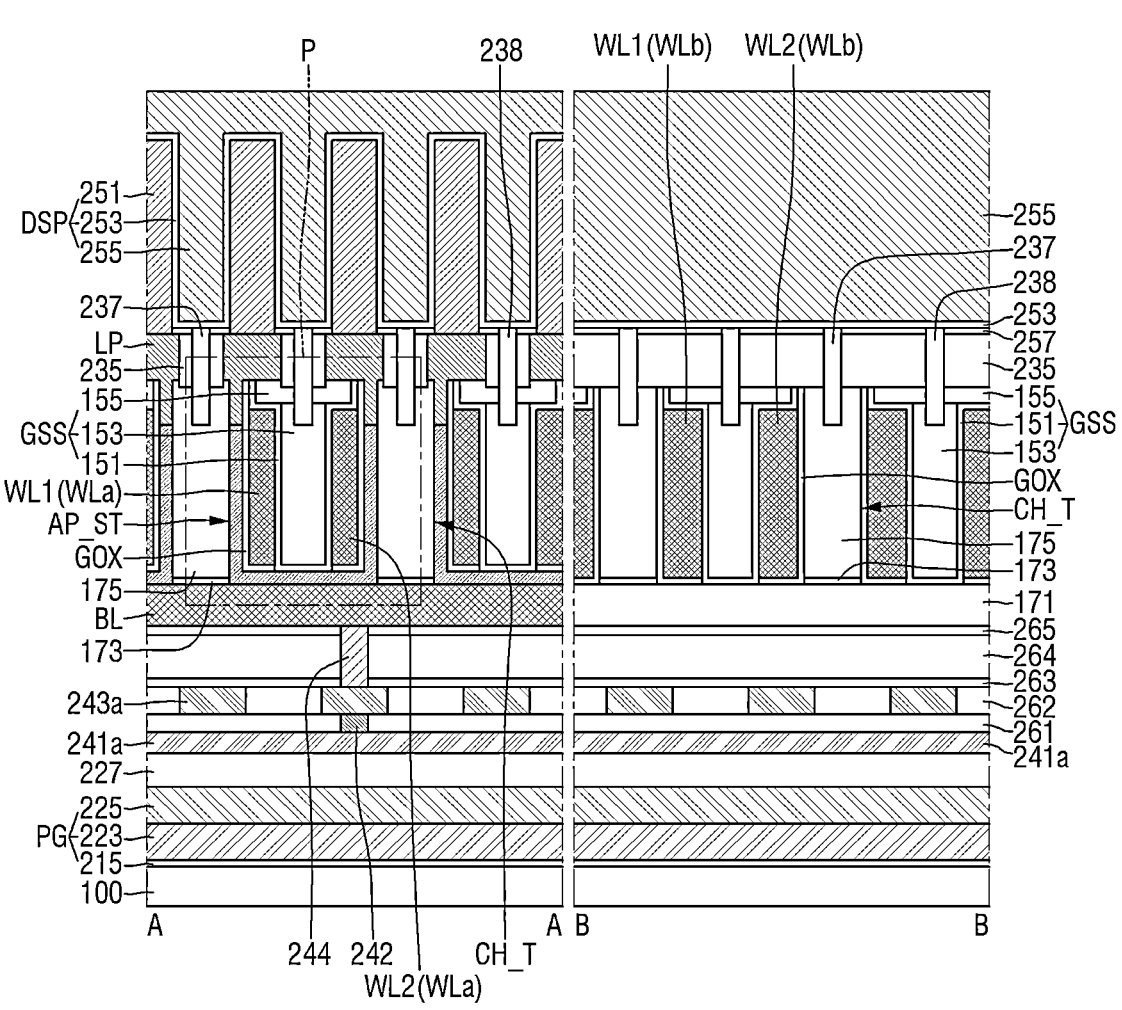
FIGS. 11 to 13 are cross-sectional views of a semiconductor memory device according to example embodiments of the present disclosure.
Figure 12:
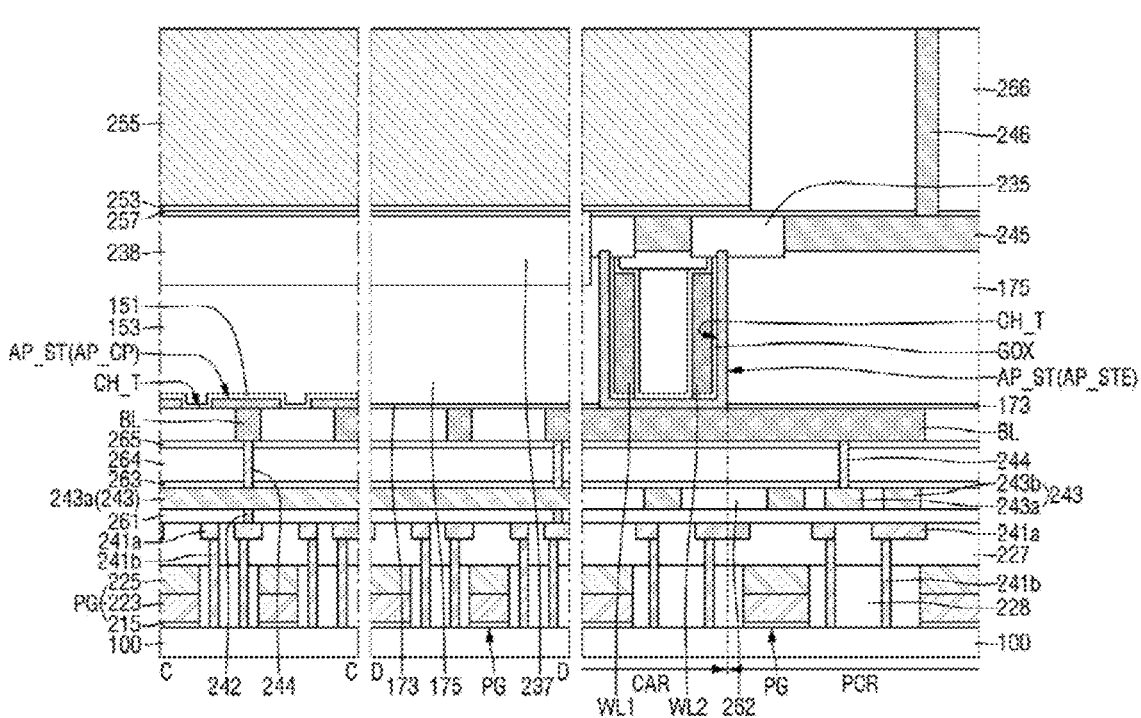
Figure 13:
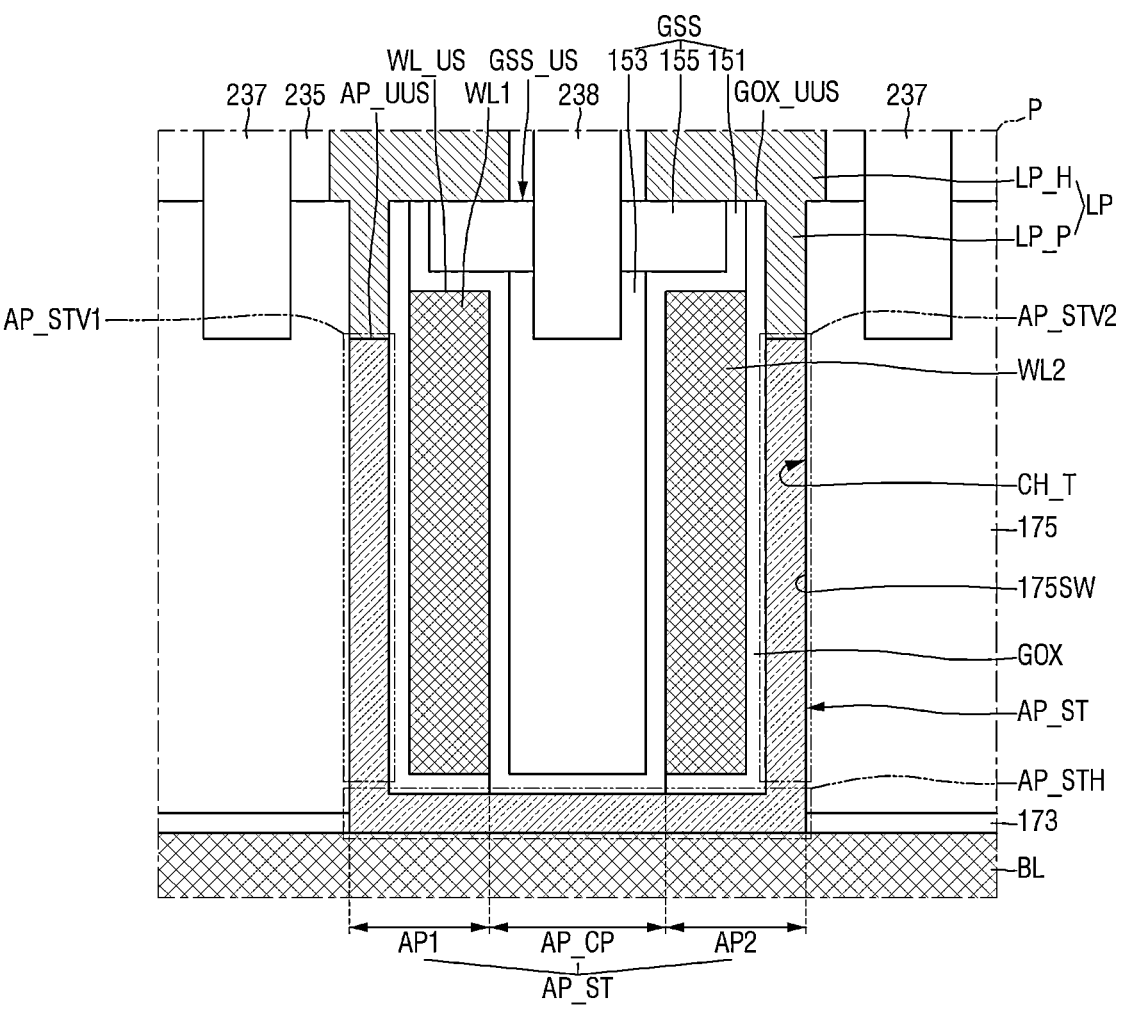

FIGS. 11 to 13 are cross-sectional views of a semiconductor memory device according to example embodiments of the present disclosure. For convenience, the embodiment of FIGS. 11 to 13 will hereinafter be described, focusing mainly on the differences with the embodiment of FIGS. 1 to 7.

For reference, FIG. 13 is a cross-sectional view of part P of FIG. 11.

Referring to FIGS. 11 to 13, the semiconductor memory device may further include second passage patterns 238.

The second passage patterns 238 may penetrate a cell upper etch stopper film 257 and pad separation insulating patterns 235. The second passage patterns 238 may be connected to gate separation patterns GSS.

The second passage patterns 238 may be in contact with the gate separation patterns GSS. The second passage patterns 238 may be in contact with a capacitor dielectric film 253.

The second passage patterns 238 may be connected to gate separation filling films 153 through gate separation capping films 155.

The second passage patterns 238 may be formed of an insulating material including a Si-based oxide. The second passage patterns 238 may be formed of, for example, silicon oxide.

Unlike what is illustrated, first passage patterns 237, which penetrate the cell upper etch stopper film 257 and the pad separation insulating patterns 235, may not be provided.

Figure 14:
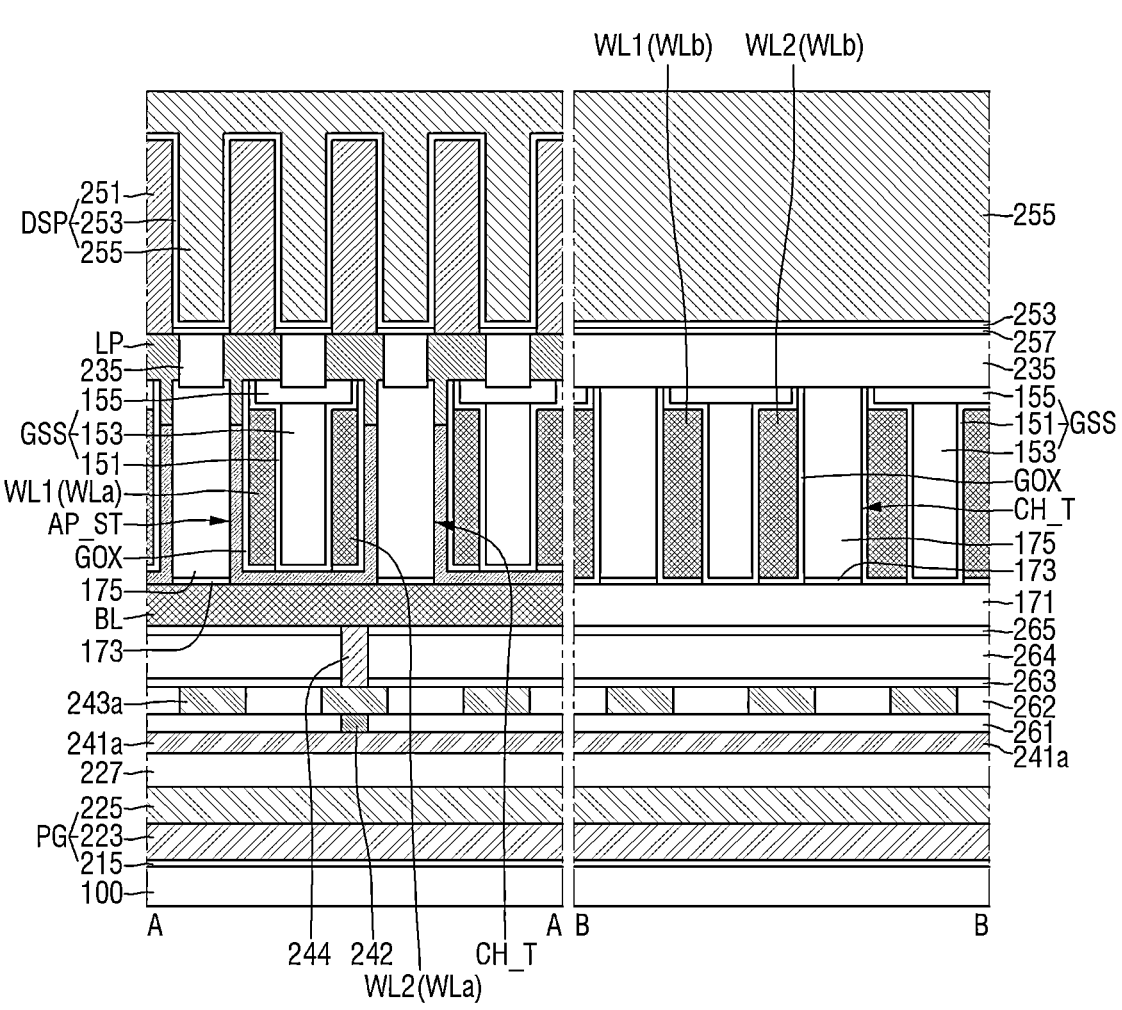
FIGS. 14 and 15 are cross-sectional views of a semiconductor memory device according to example embodiments of the present disclosure.
Figure 15:
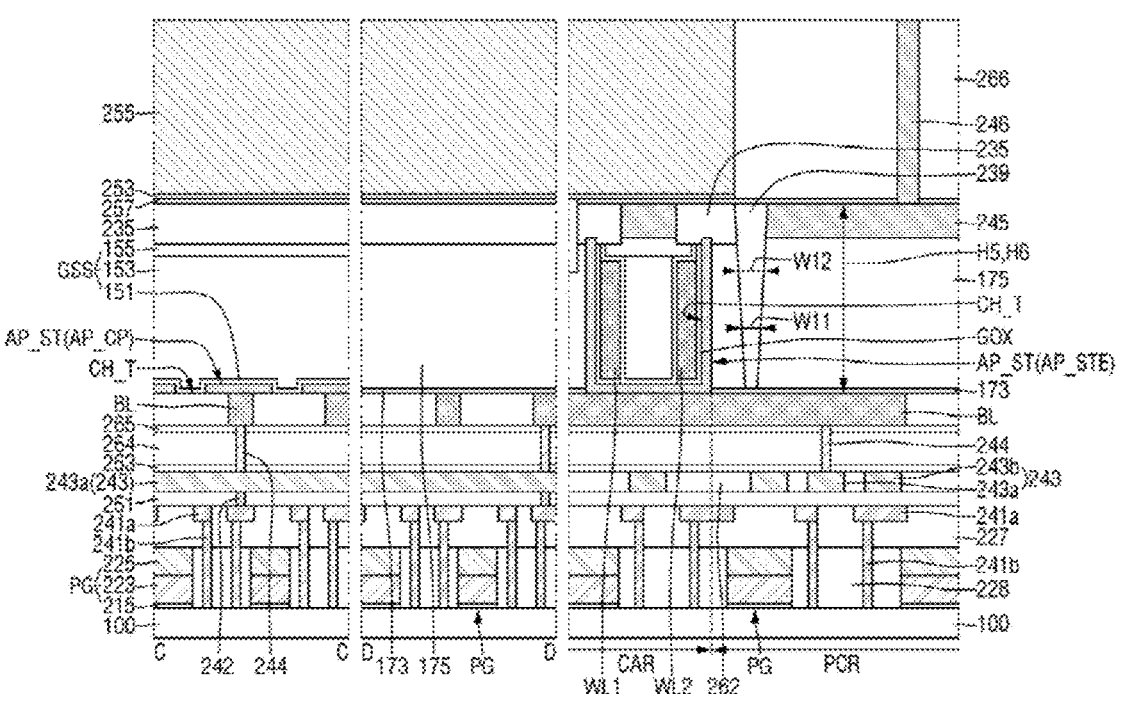

FIGS. 14 and 15 are cross-sectional views of a semiconductor memory device according to example embodiments of the present disclosure. For convenience, the embodiment of FIGS. 14 and 15 will hereinafter be described, focusing mainly on the differences with the embodiment of FIGS. 1 to 7.

Referring to FIGS. 14 and 15, the semiconductor memory device may further include cell blocking patterns 239.

The cell blocking patterns 239 may be disposed between outermost channel structures AP_STE and upper peripheral lines 245. The cell blocking patterns 239 may extend in a third direction D3.

The cell blocking patterns 239 may extend from the upper peripheral lines 245 to a cell lower etch stopper film 173. The cell blocking patterns 239 may be in contact with the upper peripheral lines 245. Unlike what is illustrated, the cell blocking patterns 239 may be in contact with bitlines BL through the cell lower etch stopper film 173.

For example, a height H5 from the upper surfaces of the bitlines BL to the upper surfaces of the cell blocking patterns 239 may be the same as a height H6 from the upper surfaces of the bitlines BL to the upper surfaces of the upper peripheral lines 245. During the manufacturing process, the cell blocking patterns 239 may be formed after the formation of the upper peripheral lines 245.

Unlike what is illustrated, the upper surfaces of the cell blocking patterns 239 may be lower than the upper surfaces of the upper peripheral lines 245 with respect to the upper surface of bitlines BL. During the manufacturing process, the cell blocking patterns 239 may be formed before the formation of the upper peripheral lines 245.

The cell blocking patterns 239 may include first points and second points having different heights. The height from the upper surfaces of the bitlines BL to the first points of the cell blocking patterns 239 may be less than the height from the upper surfaces of the bitlines BL to the second points of the cell blocking patterns 239. A width Wi 1, in a second direction D2, of the cell blocking patterns 239 at the first points in the cell blocking patterns 239 may be less than a width W12, in the second direction D2, of the cell blocking patterns 239 at the second points in the cell blocking patterns 239. The width of the cell blocking patterns 239 may decrease away from the upper peripheral lines 245. For example, the cell blocking patterns 239 may have a tapered shape that narrows in a direction toward the bitlines BL.

The cell blocking patterns 239 may be formed of, for example, an insulating material including a Si-based nitride. The cell blocking patterns 239 may be formed of silicon nitride, but the present disclosure is not limited thereto.

The cell blocking patterns 239 may prevent the diffusion of impurities into a cell array region CAR. As a result, the reliability and the performance of the semiconductor memory device can be improved.

The cell blocking patterns 239 may extend lengthwise in a first direction D1 along the boundaries of the cell array region CAR, but the present disclosure is not limited thereto. Although not illustrated, the cell blocking patterns 239 may extend lengthwise in the second direction D2 along the boundaries of the cell array region CAR. The cell blocking patterns 239 may extend in the first direction D1 and second direction D2 along the boundaries of the cell array region CAR.

Unlike what is illustrated in FIGS. 14 and 15, first passage patterns 237 and/or second passage patterns 238, which penetrate a cell upper etch stopper film 257 and pad separation insulating patterns 235, may be further disposed.

Figure 16:
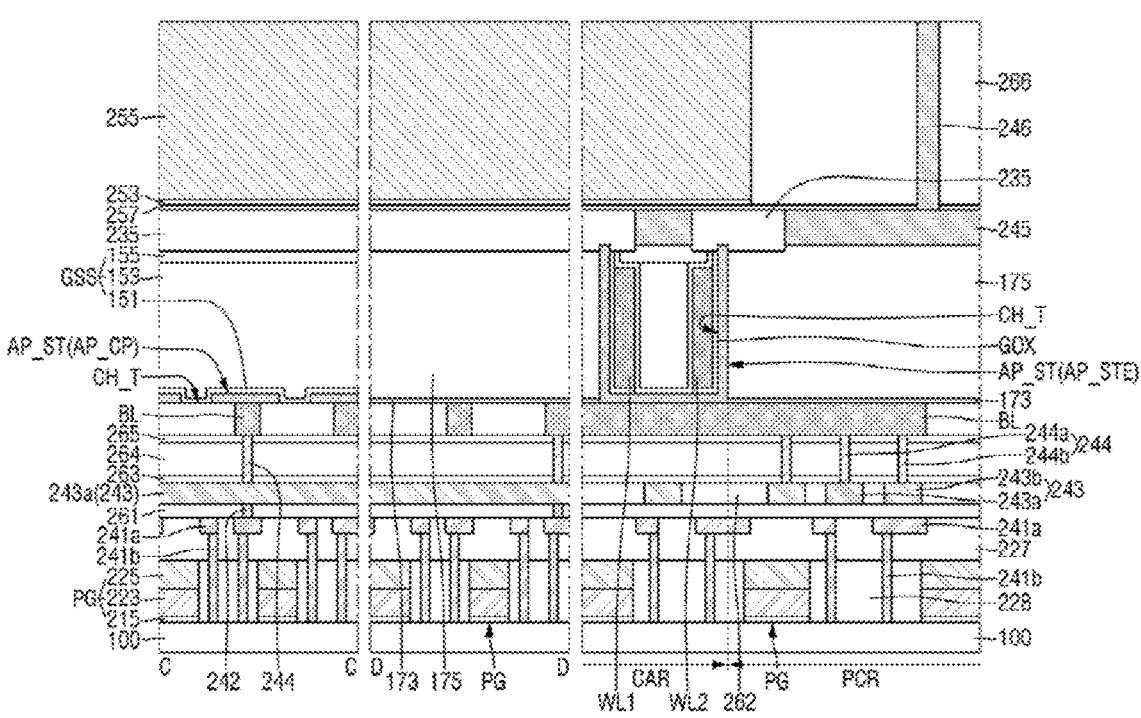
FIG. 16 is a cross-sectional view of a semiconductor memory device according to example embodiments of the present disclosure.

FIG. 16 is a cross-sectional view of a semiconductor memory device according to example embodiments of the present disclosure. For convenience, the embodiment of FIG. 16 will hereinafter be described, focusing mainly on the differences with the embodiment of FIGS. 1 to 7.

For reference, a cross-sectional view of the embodiments of FIG. 16, taken along lines A-A and B-B of FIG. 2 may be the same as with FIG. 14.

Referring to FIG. 16, bitlines BL may be connected to a plurality of cell connection plugs 244. The bitlines BL may be connected to a plurality of second lower peripheral lines 243.

The cell connection plugs 244 may include normal cell connection plugs 244a and dummy cell connection plugs 244b. The normal cell connection plugs 244a may connect second lower normal lines 243a and the bitlines BL. The dummy cell connection plugs 244b may connect second lower dummy lines 243b and bitlines BL.

The cell connection plugs 244 may be used as passages for the diffusion of impurities. Impurities diffused through the cell connection plugs 244 may be provided to lower peripheral lines (241a and 243) and a peripheral gate structure PG. The impurities provided through the lower peripheral lines (241a and 243) and the peripheral gate structure PG may lower the resistance of conductive lines. As a result, the performance and the reliability of the semiconductor memory device can be improved.

The dummy cell connection plugs 244b are disposed to be connected to the bitlines BL, thereby, passages for the diffusion of impurities can be increased.

Unlike what is illustrated in FIGS. 14 and 16, first passage patterns 237 and/or second passage patterns 238, which penetrate a cell upper etch stopper film 257 and pad separation insulating patterns 235, may be further disposed.

Figure 17:
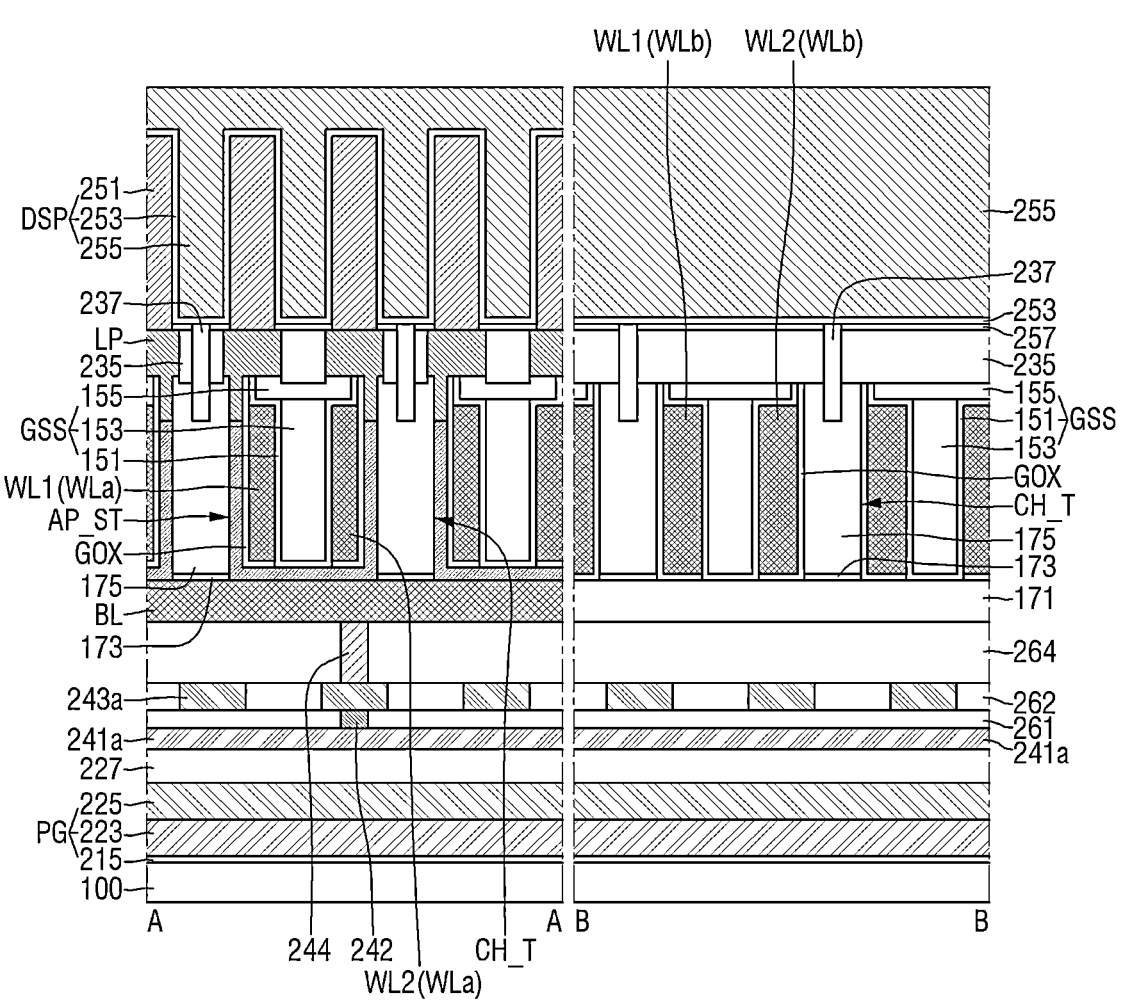
FIGS. 17 and 18 is a cross-sectional view of a semiconductor memory device according to example embodiments of the present disclosure.
Figure 18:
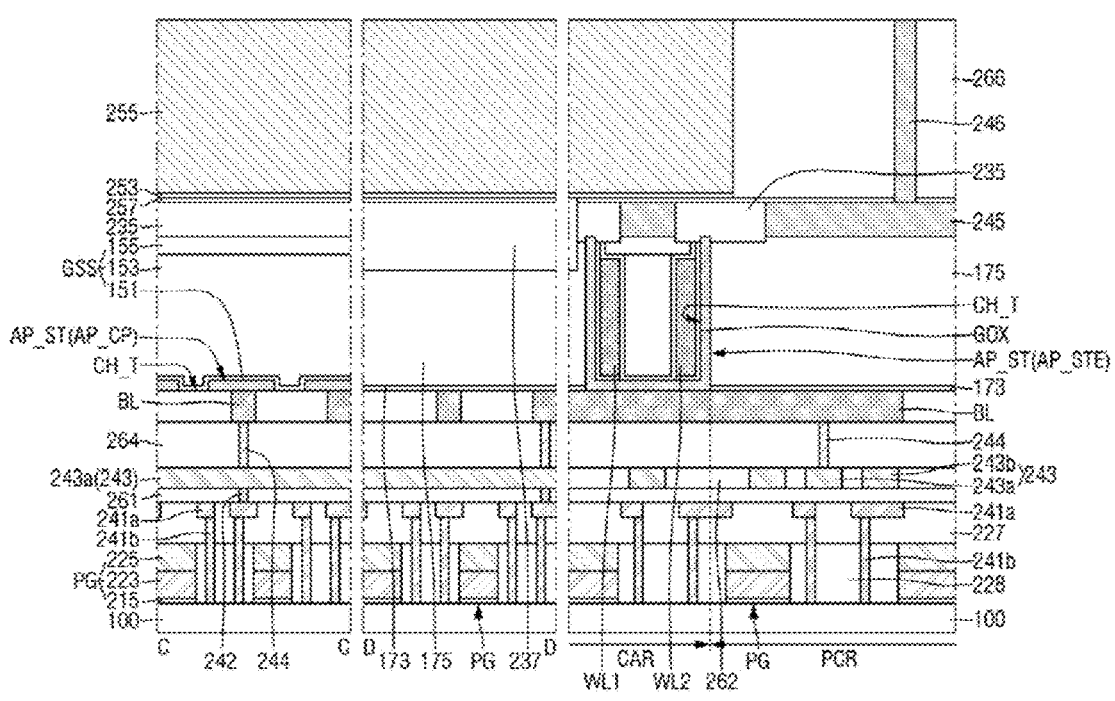

FIGS. 17 and 18 is a cross-sectional view of a semiconductor memory device according to example embodiments of the present disclosure. For convenience, the embodiment of FIGS. 17 and 18 will hereinafter be described, focusing mainly on the differences with the embodiment of FIGS. 1 to 7.

Referring to FIGS. 17 and 18, in a semiconductor memory device according to example embodiments, cell connection plugs 244 may be disposed in a single film.

Without the third peripheral upper insulating films 263 and the fifth peripheral upper insulating films 265, the cell connection plugs 244 may be disposed in the fourth peripheral upper insulating film 264. The cell connection plugs 244 may be disposed in a single film formed of an oxide-based insulating material.

As the third peripheral upper insulating film 263 and fifth peripheral upper insulating film 265 are removed, impurities may be smoothly provided to lower peripheral lines (241a and 243) and peripheral gate structure PG. As a result, the performance and the reliability of the semiconductor memory device can be improved.

Unlike what is illustrated, first passage patterns 237, which penetrate a cell upper etch stopper film 257 and pad separation insulating patterns 235, may not be provided.

FIGS. 19 to 22 are plan views or cross-sectional views of a semiconductor memory device according to example embodiments of the present disclosure. For convenience, the embodiment of FIGS. 19 to 22 will hereinafter be described, focusing mainly on the differences with the embodiment of FIGS. 1 to 7.

Figure 19:
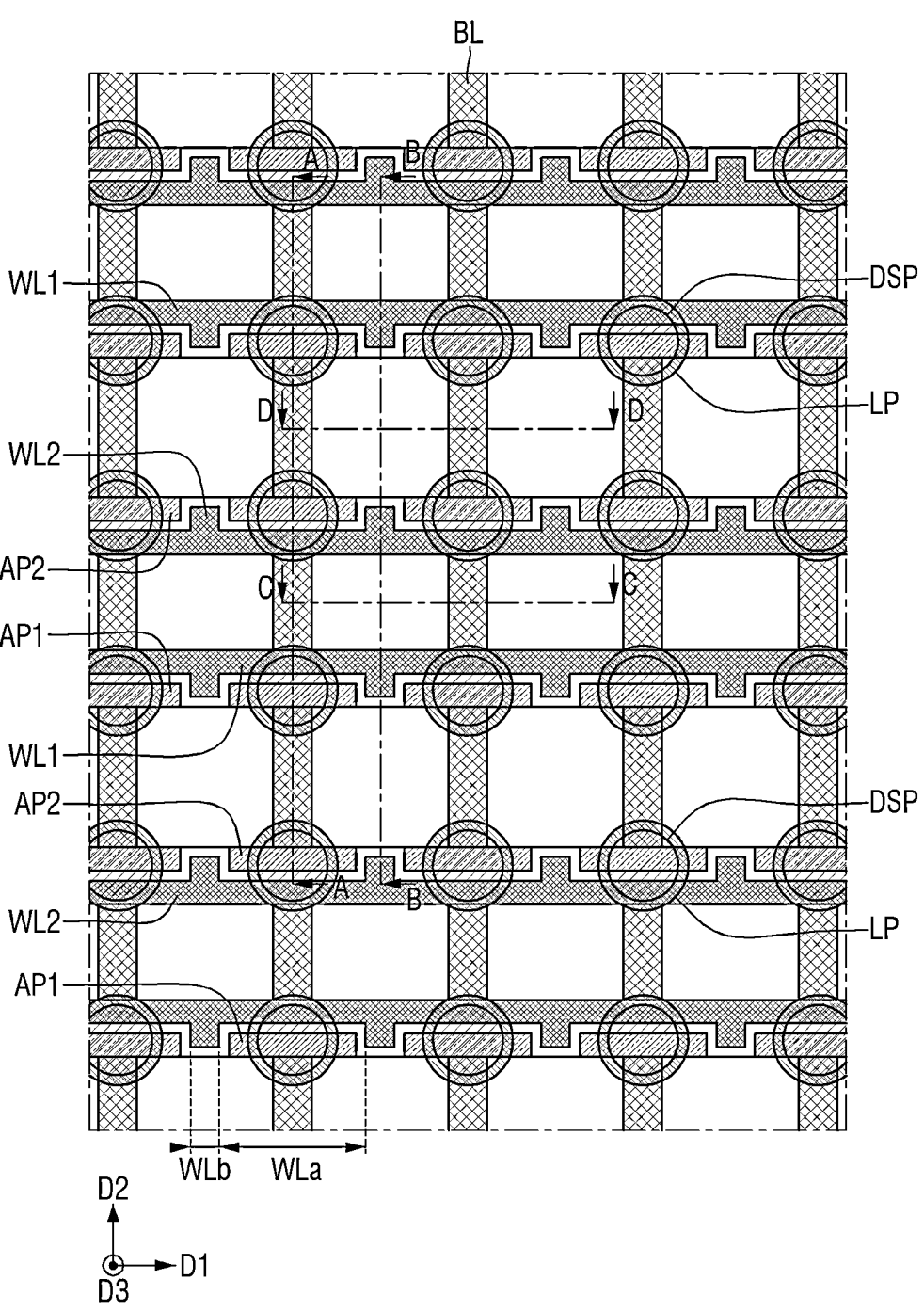
FIGS. 19 to 22 are plan views or cross-sectional views of a semiconductor memory device according to example embodiments of the present disclosure.
Figure 20:
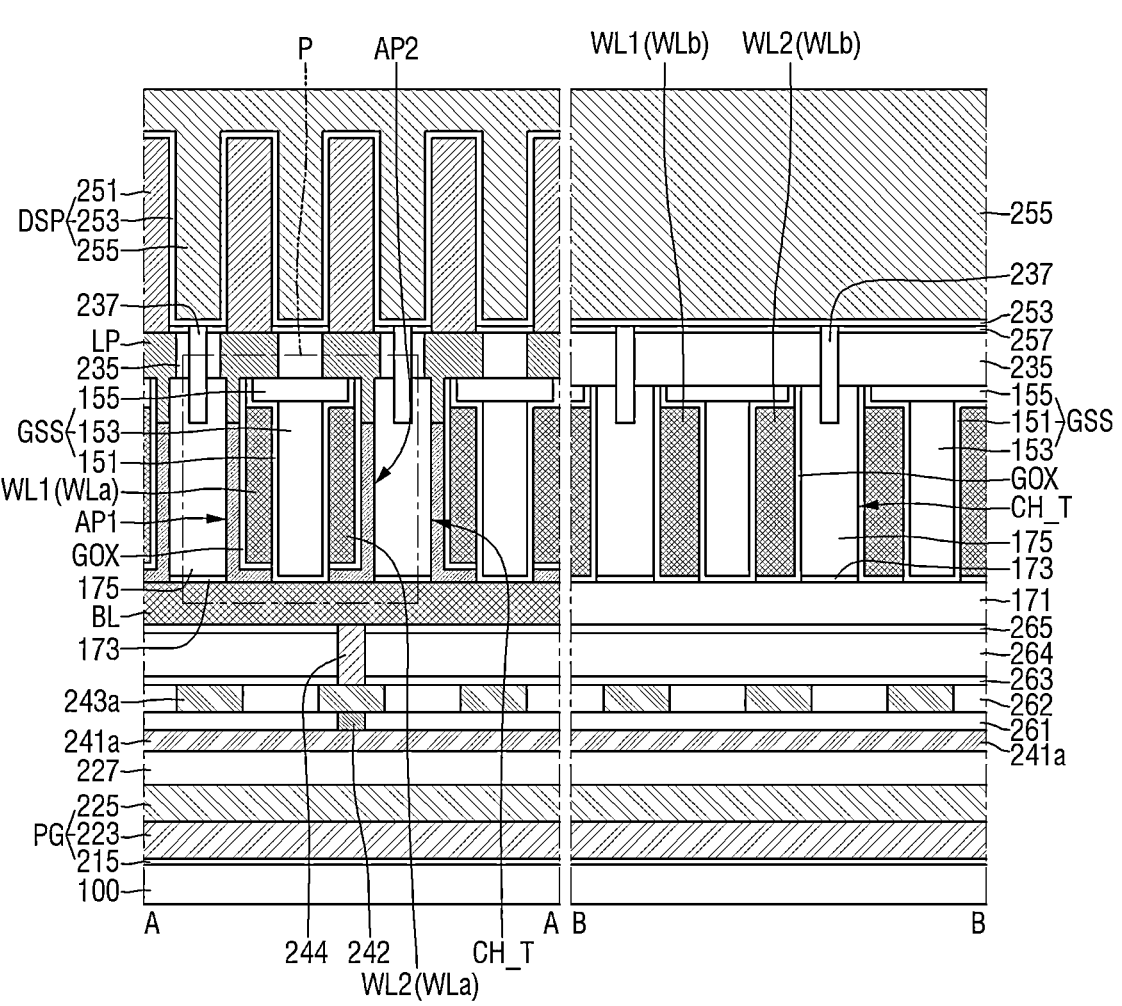
Figure 21:
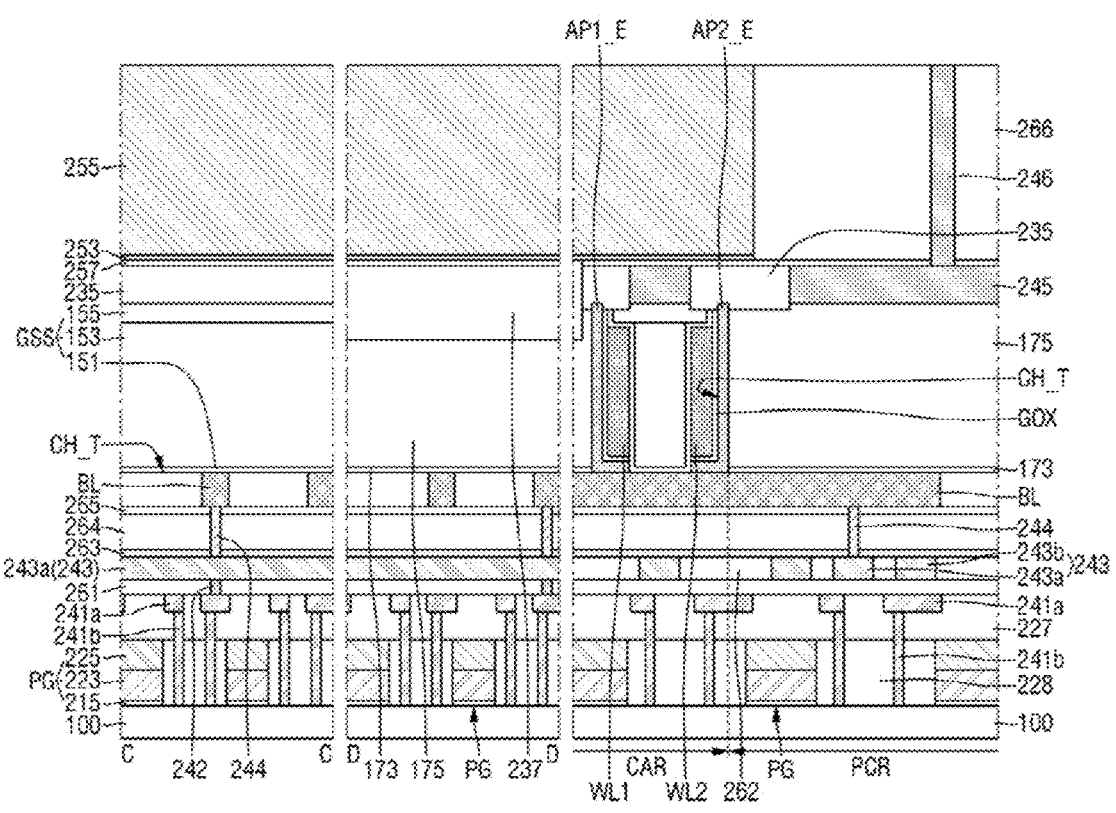
Figure 22:
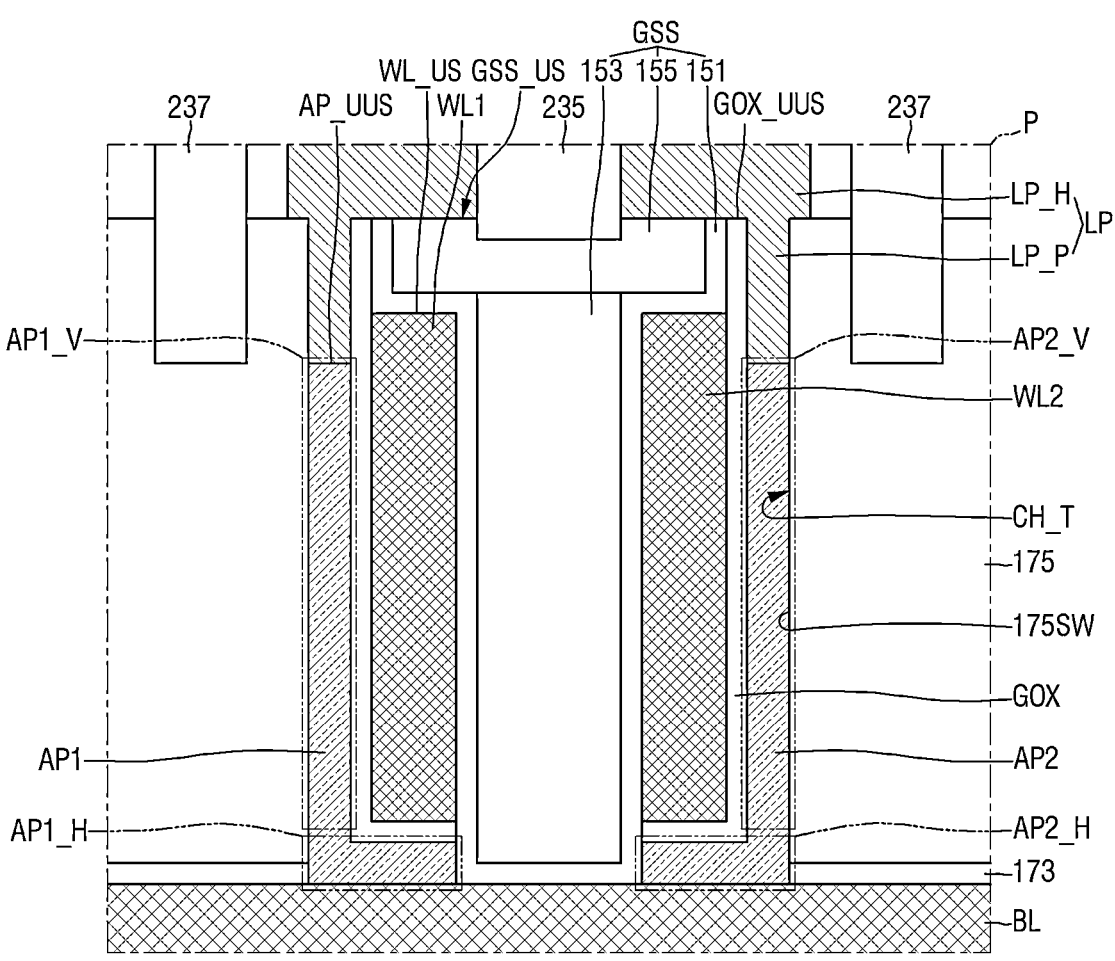

For reference, FIG. 19 is a plan view of a semiconductor memory device according to example embodiments of the present disclosure. FIG. 20 is a cross-sectional view taken along lines A-A and B-B of FIG. 19. FIG. 21 is a cross-sectional view taken along lines C-C and D-D of FIG. 19. FIG. 22 is an enlarged cross-sectional view of part P of FIG. 20.

Referring to FIGS. 19 to 22, in a semiconductor memory device according to example embodiments, first channel patterns AP1 and second channel patterns AP2 that are spaced apart in a second direction D2 may not be connected in channel trenches CH_T.

The first channel patterns AP1 may include horizontal portions AP1_H, which extend along the upper surfaces of bitlines BL, and vertical portions AP1_V, which extend along sidewalls 175SW of a protruding insulating pattern 175. The vertical portions AP1_V of the first channel patterns may protrude from the horizontal portions AP1_H of the first channel patterns in a third direction D3.

The second channel patterns AP2 may include horizontal portions AP2_H, which extend along the upper surfaces of the bitlines BL, and vertical portions AP2_V, which extend along the sidewalls 175SW of the protruding insulating pattern 175. The vertical portions AP2_V of the second channel patterns may protrude from the horizontal portions AP2_H of the second channel patterns in the third direction D3.

The first channel patterns AP1 may include first outermost channel patterns AP1_E, which are disposed in the outermost part of a cell array region CAR. The second channel patterns AP2 may include second outermost channel patterns AP2_E, which are disposed in the outermost part of the cell array region CAR.

Gate separation patterns GSS may be in contact with the bitlines BL. The horizontal portions AP2_H of the second channel patterns AP2 and the horizontal portions AP1_H of the first channel patterns AP1 may be spatially separated from one another by the gate separation patterns GSS. Gate separation liners 151 may be in contact with the bitlines BL.

FIGS. 23 to 26 are plan views of semiconductor memory devices according to example embodiments of the present disclosure. For convenience, the embodiments of FIGS. 23 to 26 will hereinafter be described, focusing mainly on the differences with the embodiment of FIGS. 1 to 7.

Figure 23:
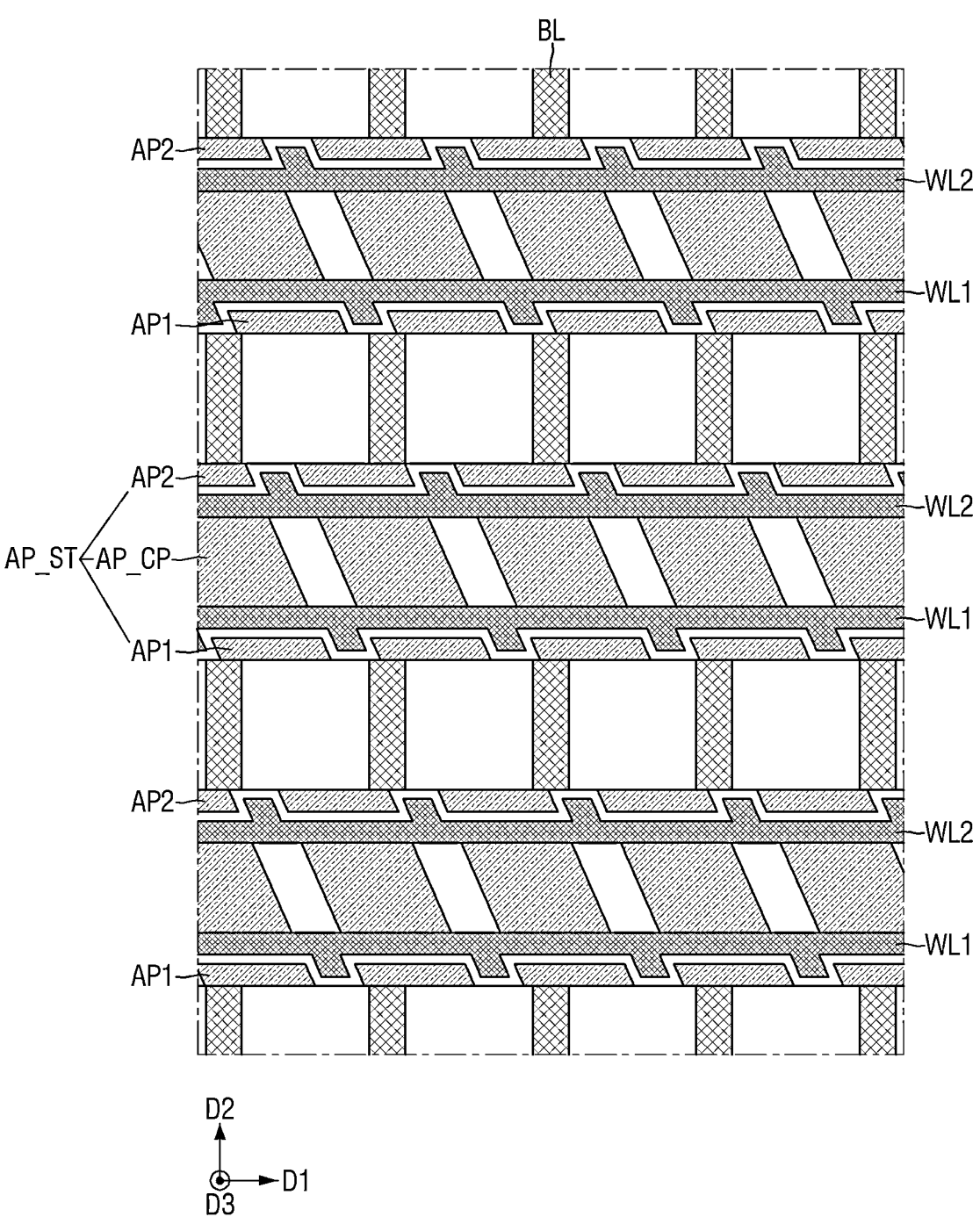
FIGS. 23 to 26 are plan views of semiconductor memory devices according to example embodiments of the present disclosure.

Referring to FIG. 23, in a semiconductor memory device according to example embodiments, first channel patterns AP1 and second channel patterns AP2 may be alternately arranged in diagonal directions with respect to first and second directions D1 and D2. Here, the diagonal directions may be parallel to the upper surface of a substrate 100.

Channel structures AP_ST may be formed to be twisted diagonally. In a plan view, the first channel patterns AP1, the second channel patterns AP2, and connecting channel patterns AP_CP may have a parallelogram shape or a diamond shape.

Figure 24:
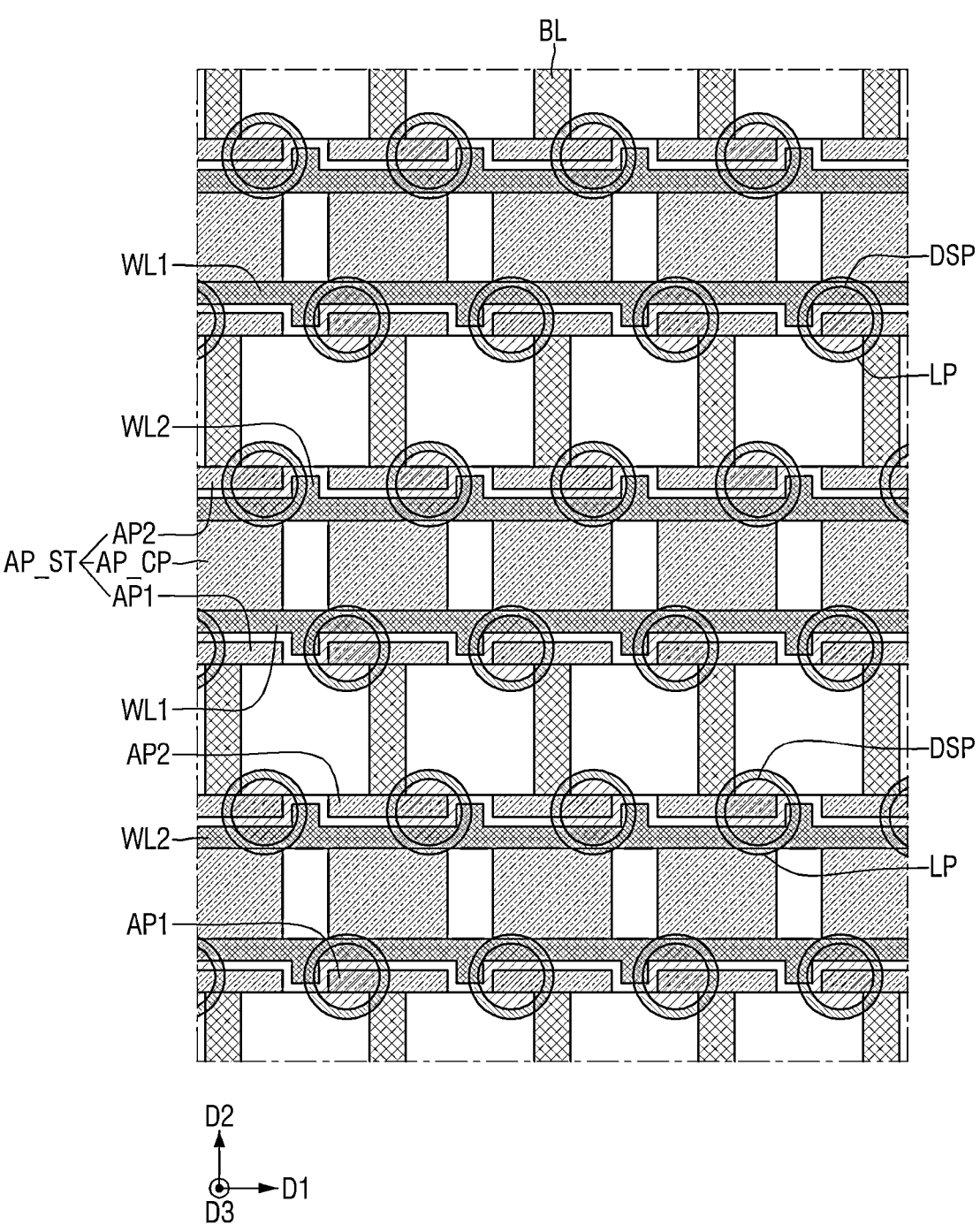

Referring to FIG. 24, in a semiconductor memory device according to some embodiments, landing pads LP and data storage patterns DSP may be arranged in a zigzag fashion or a honeycomb fashion in a plan view.

Figure 25:
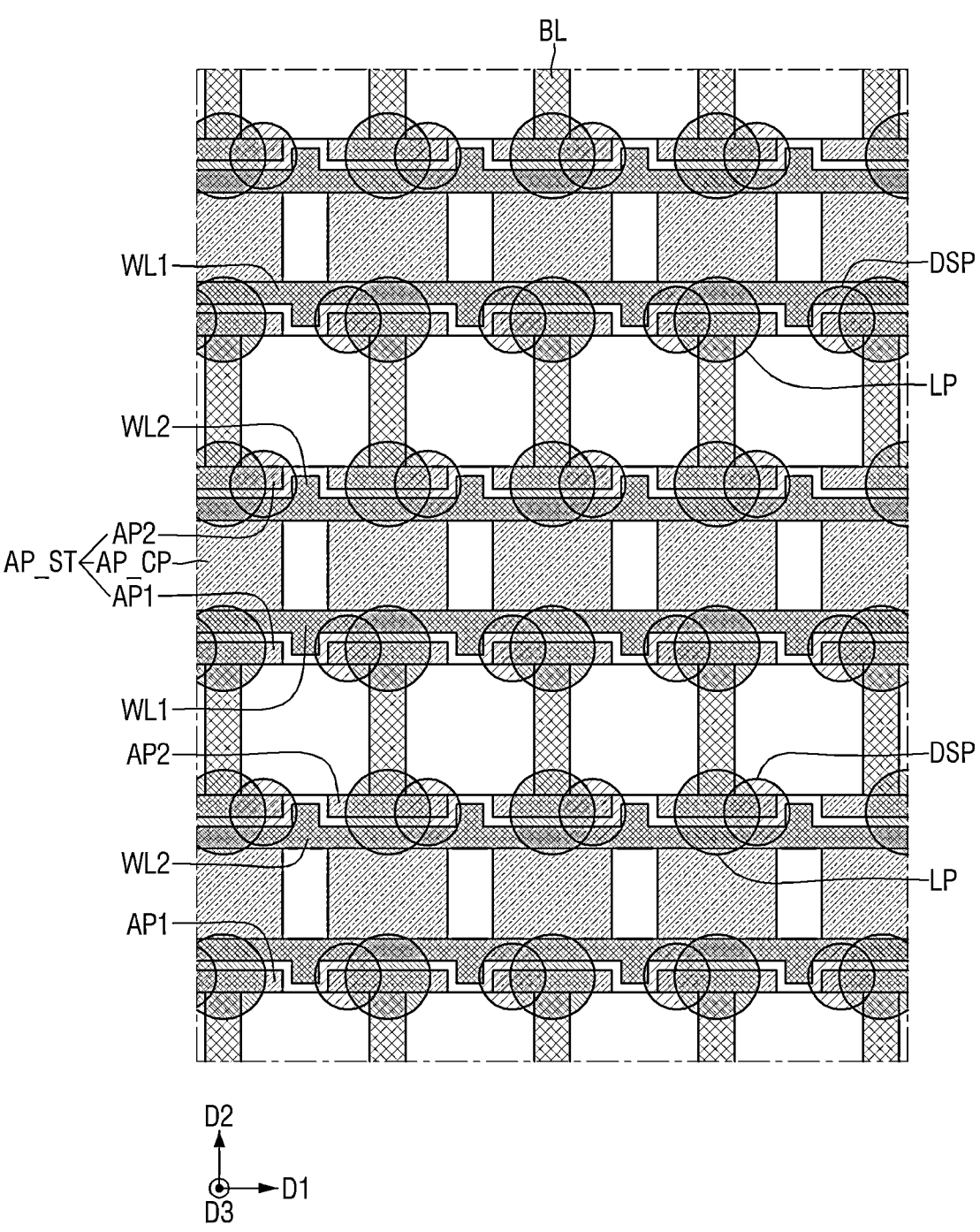

Referring to FIG. 25, in a semiconductor memory device according to some embodiments, data storage patterns DSP may be disposed to be misaligned with landing pads LP in a plan view.

The data storage patterns DSP may be in contact with a portion of the landing pads LP.

Figure 26:
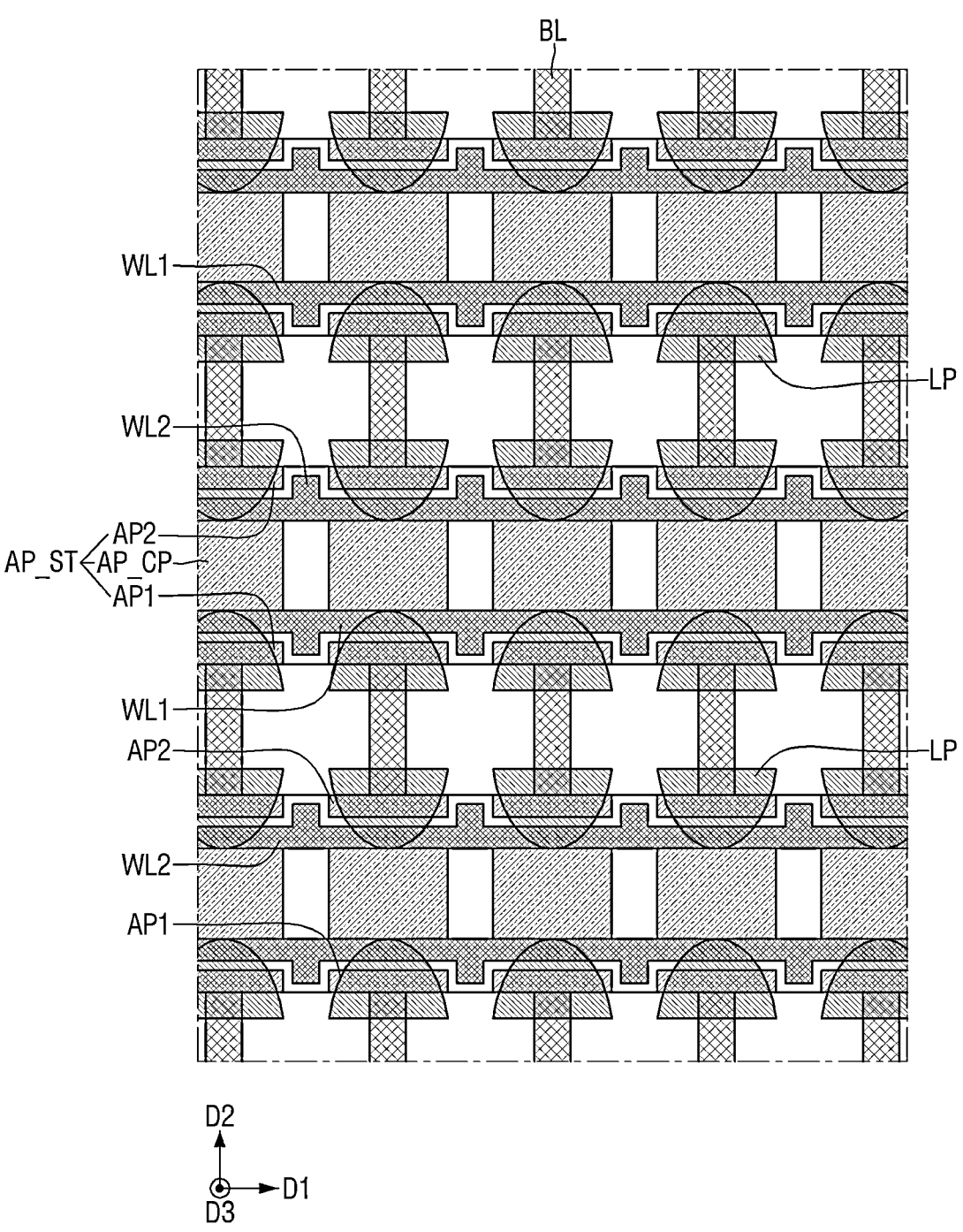

Referring to FIG. 26, landing pads LP, which are disposed on first channel patterns AP1 and second channel patterns AP2, may have a semicircular shape or a semielliptical shape in a plan view.

In a plan view, the landing pads LP may be disposed symmetrically to one another.

In concluding the detailed description, those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

What is claimed is:

1. A semiconductor memory device comprising:
a peripheral gate structure on a substrate;
bitlines disposed on the peripheral gate structure and extending lengthwise in a first direction;
a protruding insulating pattern including channel trenches, which extend in a second direction that intersects the first direction;
channel structures disposed on the bitlines in the channel trenches and including a metal oxide;
first wordlines disposed on the channel structures and extending lengthwise in the second direction;
second wordlines disposed on the channel structures, extending lengthwise in the second direction, and spaced apart from the first wordlines in the first direction;
landing pads disposed on the channel structures and connected to the channel structures;
pad separation patterns disposed on the protruding insulating pattern and separating the landing pads;
first passage patterns connected to the protruding insulating pattern through the pad separation patterns and formed of an oxide-based insulating material; and
data storage patterns disposed on the landing pads.

2. The semiconductor memory device of claim 1, further comprising:
gate separation patterns disposed between the first wordlines and the second wordlines and filling the channel trenches; and
second passage patterns connected to the gate separation patterns through the pad separation patterns and formed of an oxide-based insulating material.

3. The semiconductor memory device of claim 2,
wherein the gate separation patterns include gate separation filling films and gate separation capping films, which are disposed on the gate separation filling films, and
wherein the second passage patterns are connected to the gate separation filling films through the gate separation capping films.

4. The semiconductor memory device of claim 1,
wherein the data storage patterns include lower electrodes on the landing pads, a capacitor dielectric film on the lower electrodes, and an upper electrode on the capacitor dielectric film, and
wherein the first passage patterns are in contact with the capacitor dielectric film.

5. The semiconductor memory device of claim 1,
wherein each of the first wordlines includes first portions and second portions, which are alternately arranged in the second direction, and
wherein a width, in the first direction, of the first portions of the first wordlines is less than a width, in the first direction, of the second portions of the first wordlines.

6. The semiconductor memory device of claim 5, wherein the channel structures is disposed between second portions of the first wordlines adjacent in the second direction.

7. The semiconductor memory device of claim 1, further comprising:
a gate insulating film disposed between the channel structures and the first wordlines,
wherein a height from the bitlines to an uppermost part of the gate insulating film is greater than a height from the bitlines to uppermost parts of the first wordlines.

8. The semiconductor memory device of claim 1, further comprising:
a gate insulating film disposed between the channel structures and the first wordlines,
wherein each of the channel structures includes a horizontal portion, which extends along a bottom surface of the channel trenches, and vertical portions, which protrude from the horizontal portion, and
wherein a height from the bitlines to an uppermost part of the gate insulating film is greater than a height from the bitlines to uppermost parts of the vertical portions of the channel structures.

9. A semiconductor memory device comprising:
a substrate including a cell array region and a peripheral circuit region;
a peripheral gate structure on the substrate;
lower peripheral lines disposed on the peripheral gate structure and connected to the peripheral gate structure;
dummy peripheral lines disposed on the peripheral gate structure and not connected to the peripheral gate structure;
bitlines disposed on the lower peripheral lines and the dummy peripheral lines and extending lengthwise in a first direction;
bitline plugs connecting the bitlines and the lower peripheral lines in the peripheral circuit region;
dummy bitline plugs connecting the bitlines and the dummy peripheral lines in the peripheral circuit region;
a protruding insulating pattern including channel trenches, which extend in a second direction that intersects the first direction, the channel trenches being disposed on the cell array region of the substrate;
channel structures disposed on the bitlines in the channel trenches and including a metal oxide;
first wordlines disposed on the channel structures and extending lengthwise in the second direction;
second wordlines disposed on the channel structures, extending lengthwise in the second direction, and spaced apart from the first wordlines in the first direction;
landing pads disposed on the channel structures and connected to the channel structures;
pad separation patterns disposed on the protruding insulating pattern and separating the landing pads; and
capacitors disposed on the landing pads.

10. The semiconductor memory device of claim 9, further comprising:
passage patterns connected to the protruding insulating pattern penetrating the pad separation patterns and formed of an oxide.

11. The semiconductor memory device of claim 9, further comprising:
a gate insulating film disposed between the channel structures and the first wordlines,
wherein each of the channel structures includes a horizontal portion, which extends along a bottom surface of one of the channel trenches, and vertical portions, which protrude from the horizontal portion, and wherein a height from the bitlines to an uppermost part of the gate insulating film is greater than a height from the bitlines to uppermost parts of the vertical portions of the channel structures.

12. The semiconductor memory device of claim 9, wherein each of the first wordlines includes first portions and second portions, which are alternately arranged in the second direction, wherein a width in the first direction of the first portions of the first wordlines is less than a width, in the first direction, of the second portions of each of the first wordlines, and wherein each of the channel structures is disposed between second portions of the first wordlines adjacent in the second direction.

* * * * *